(12) United States Patent
Cheng et al.

(10) Patent No.: US 10,811,075 B1
(45) Date of Patent: Oct. 20, 2020

(54) METHOD FOR PERFORMING ACCESS CONTROL REGARDING QUALITY OF SERVICE OPTIMIZATION OF MEMORY DEVICE WITH AID OF MACHINE LEARNING, ASSOCIATED MEMORY DEVICE AND CONTROLLER THEREOF

(71) Applicant: Silicon Motion Inc., Hsinchu County (TW)

(72) Inventors: Chiao-Wen Cheng, Taichung (TW); Zhen-U Liu, Taoyuan (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/543,639

(22) Filed: Aug. 19, 2019

(51) Int. Cl.
| | | |
|---|---|---|
| *G11C 11/406* | (2006.01) | |
| *G11C 8/20* | (2006.01) | |
| *G11C 7/22* | (2006.01) | |
| *G06F 12/0802* | (2016.01) | |
| *G06N 20/00* | (2019.01) | |
| *G11C 11/409* | (2006.01) | |

(52) U.S. Cl.
CPC .... *G11C 11/40603* (2013.01); *G06F 12/0802* (2013.01); *G06N 20/00* (2019.01); *G11C 7/222* (2013.01); *G11C 8/20* (2013.01); *G11C 11/409* (2013.01); *G06F 2212/7201* (2013.01)

(58) Field of Classification Search
CPC . G11C 11/40603; G11C 11/409; G11C 7/222; G11C 8/20; G06F 12/0802; G06F 2212/7201; G06N 20/00
See application file for complete search history.

(56) References Cited

U.S. PATENT DOCUMENTS

2019/0347573 A1* 11/2019 Shih ................. G06F 3/0679

\* cited by examiner

*Primary Examiner* — David Lam
(74) *Attorney, Agent, or Firm* — Winston Hsu

(57) ABSTRACT

A method for performing access control regarding quality of service (QoS) optimization of a memory device with aid of machine learning an associated apparatus (e.g. the memory device and a controller thereof) are provided. The method may include: performing background scan on the NV memory to collect valley information of voltage distribution of memory cells within the NV memory, and performing machine learning based on a reinforcement learning model according to the valley information, in order to prepare a plurality of tables through the machine learning based on the reinforcement learning model in advance, for use of reading data from the NV memory; during a first time interval, writing first data and read the first data using a first table within the plurality of tables; and during a second time interval, reading the first data using a second table within the plurality of tables.

20 Claims, 20 Drawing Sheets

| NAND | Baking Hour at 100°C | 0 | 2 | 4 | 6 | 8 | 16 | 20 | 24 |
|---|---|---|---|---|---|---|---|---|---|
| | Retention Year at 30°C | 0 | 0.63 | 1.25 | 1.88 | 2.51 | 5.01 | 6.27 | 7.52 |
| 96 Layer 3D TLC | N2 Trigger Rate \ PE | | | | | | | | |
| | 1 | 100% | 99.9% | 99.6% | 99.8% | 99.6% | 99.6% | 99.7% | 99.7% |
| | 150 | 100% | 99.7% | 99.5% | 99.6% | 99.6% | 99.8% | 99.8% | 99.7% |
| | 500 | 100% | 99.7% | 99.7% | 99.6% | 99.7% | 99.5% | 98.6% | 98.4% |
| | 1000 | 100% | 99.7% | 99.7% | 99.7% | 99.3% | 97.7% | 98.2% | 98.1% |
| | 1500 | 100% | 99.8% | 99.8% | 99.8% | 99.6% | 98.9% | 98.0% | 98.1% |
| | 3000 | 100% | 99.7% | 99.7% | 99.7% | 95.9% | 98.6% | 97.3% | 99.4% |
| | 5000 | 100% | 99.0% | 99.8% | 93.4% | 92.9% | 99.4% | 98.8% | 99.0% |
| | 10000 | 100% | 71.8% | 72.9% | 97.8% | 91.4% | 69.3% | 67.8% | 62.1% |

☐ Green:N2  ☐ Yellow:N4  ☐ Brown:N6  ☐ Orange:N8

Become worse

METHOD FOR PERFORMING ACCESS CONTROL REGARDING QUALITY OF SERVICE OPTIMIZATION OF MEMORY DEVICE WITH AID OF MACHINE LEARNING, ASSOCIATED MEMORY DEVICE AND CONTROLLER THEREOF

BACKGROUND OF THE INVENTION

1. Field of the Invention

The present invention is related to flash memory access, and more particularly, to a method for performing access control regarding quality of service (QoS) optimization of a memory device with aid of machine learning, an associated apparatus (e.g. the memory device and a controller thereof such as a memory controller within the memory device).

2. Description of the Prior Art

Developments in memory technology have led to the wide application of portable or non-portable memory devices, such as memory cards which conform to the SD/MMC, CF, MS and XD specifications, respectively, solid state drives (SSDs), or embedded memory devices which conform to the UFS and eMMC specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, as the triple level cell (TLC) flash memories and the quadruple level cell (QLC) flash memories have been applied to the memory devices, there are some problems such as an increased bit error rate, etc. In addition, the flash memories implemented with the three dimensional (3D) NAND flash architecture have been proposed in order to achieve higher storage capacity. Additional problems such as random write delay and random read delay are introduced, however. As most user behaviors may correspond to random read, the problem of random read delay may lead to lower QoS in the majority of cases. Furthermore, in a situation where the number of memory cells in the stack of the 3D NAND flash architecture increases, a floating-gate (FG) solution may be replaced by a new solution using charge-trap (CT) materials for some purposes such as easier implementation, which may correspondingly cause a data-retention problem. As a delay time of reading data may increase due to the data-retention problem, the QoS may become much lower. More particularly, the data-retention problem may trigger a moving read mechanism within the above management mechanisms to perform one or more additional read operations, causing the overall performance to be degraded. Thus, a novel method and associated architecture are needed for enhancing overall performance without introducing any side effect or in a way that is less likely to introduce a side effect.

SUMMARY OF THE INVENTION

It is an objective of the present invention to provide a method for performing access control regarding quality of service (QoS) optimization of a memory device with aid of machine learning, an associated apparatus (e.g. the memory device and a controller thereof such as a memory controller within the memory device), in order to solve the above problems.

It is another objective of the present invention to provide a method for performing access control regarding QoS optimization of a memory device with aid of machine learning, an associated apparatus (e.g. the memory device and a controller thereof such as a memory controller within the memory device), in order to enhance overall performance without introducing any side effect or in a way that is less likely to introduce a side effect.

At least one embodiment of the present invention provides a method for performing access control regarding QoS optimization of a memory device with aid of machine learning. The memory device may comprise a non-volatile (NV) memory and a memory controller for controlling the accessing of the NV memory, and the NV memory may comprise at least one NV memory element (e.g. one or more NV memory elements). The method may comprise: performing background scan on the NV memory to collect valley information of voltage distribution of memory cells within the NV memory, and performing machine learning based on a reinforcement learning model according to the valley information, in order to prepare a plurality of tables through the machine learning based on the reinforcement learning model in advance, for use of reading data from the NV memory, wherein each table of the plurality of tables comprises a set of read voltages, and the set of read voltages is obtained from the machine learning based on the reinforcement learning model; during a first time interval, writing first data and read the first data using a first table within the plurality of tables, wherein the first table is selected as a suitable table for the first data during the first time interval; and during a second time interval, reading the first data using a second table within the plurality of tables, wherein the second table is selected as the suitable table for the first data during the second time interval, and the second time interval is a next time interval of the first time interval on a time axis.

In addition to the above method, the present invention also provides a memory device, and the memory device comprises a NV memory and a controller. The NV memory is arranged to store information, wherein the NV memory may comprise at least one NV memory element (e.g. one or more NV memory elements). The controller is coupled to the NV memory, and the controller is arranged to control operations of the memory device. In addition, the controller comprises a processing circuit that is arranged to control the controller according to a plurality of host commands from a host device to allow the host device to access the NV memory through the controller. For example, the controller performs background scan on the NV memory to collect valley information of voltage distribution of memory cells within the NV memory, and performs machine learning based on a reinforcement learning model according to the valley information, in order to prepare a plurality of tables through the machine learning based on the reinforcement learning model in advance, for use of reading data from the NV memory, wherein each table of the plurality of tables comprises a set of read voltages, and the set of read voltages is obtained from the machine learning based on the reinforcement learning model; during a first time interval, the controller writes first data and reads the first data using a first table within the plurality of tables, wherein the first table is selected as a suitable table for the first data during the first time interval; and during a second time interval, the controller reads the first data using a second table within the plurality of tables, wherein the second table is selected as the suitable table for the first data during the second time interval, and the second time interval is a next time interval of the first time interval on a time axis.

In addition to the above method, the present invention also provides a controller of a memory device, where the memory device comprises the controller and a NV memory. The NV memory may comprise at least one NV memory element (e.g. one or more NV memory elements). In addition, the controller comprises a processing circuit that is arranged to control the controller according to a plurality of host commands from a host device, to allow the host device to access the NV memory through the controller. For example, the controller performs background scan on the NV memory to collect valley information of voltage distribution of memory cells within the NV memory, and performs machine learning based on a reinforcement learning model according to the valley information, in order to prepare a plurality of tables through the machine learning based on the reinforcement learning model in advance, for use of reading data from the NV memory, wherein each table of the plurality of tables comprises a set of read voltages, and the set of read voltages is obtained from the machine learning based on the reinforcement learning model; during a first time interval, the controller writes first data and reads the first data using a first table within the plurality of tables, wherein the first table is selected as a suitable table for the first data during the first time interval; and during a second time interval, the controller reads the first data using a second table within the plurality of tables, wherein the second table is selected as the suitable table for the first data during the second time interval, and the second time interval is a next time interval of the first time interval on a time axis.

The present invention method and associated apparatus can guarantee that the whole system (e.g. the host device and the memory device) can operate properly, to prevent problems in the related art, such as the increased bit error rate, the increased random read delay, and some associated problems due to the data-retention problem. In addition, implementing the embodiments of the present invention does not significantly increase additional costs. Therefore, the related art problems can be solved, and the overall cost will not increase too much. In comparison with the related art, the present invention method and associated apparatus can enhance overall performance without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
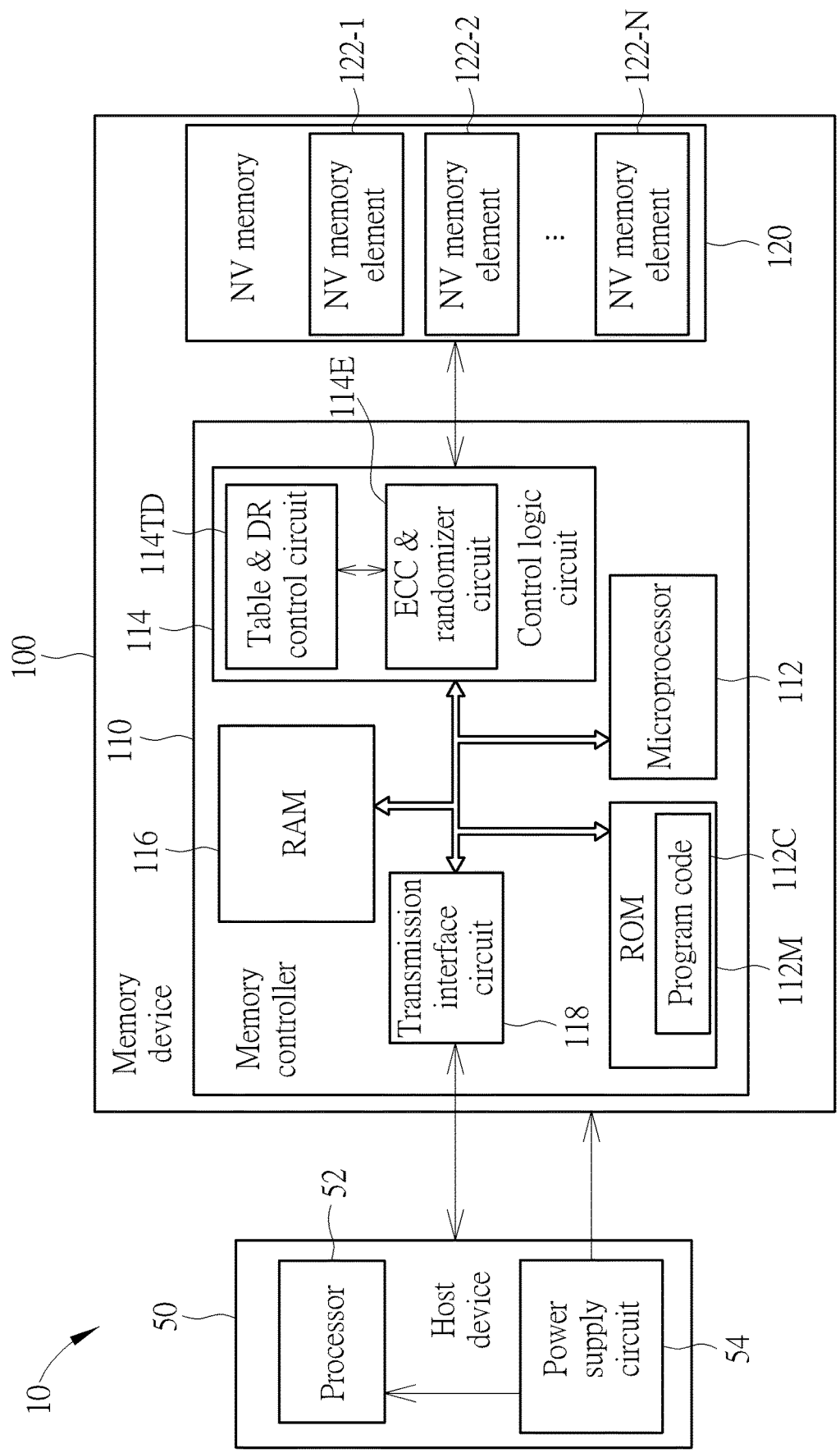
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a controller such as a memory controller 110, and may further comprise a non-volatile (NV) memory 120, where the controller is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent a positive integer that is greater than one. For example, the NV memory 120 may be a flash memory, and the plurality of NV memory elements 122-1, 122-2, . . . , and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory 120, and may comprise a data protection circuit for protecting data and/or performing error correction, where the data protection circuit may comprise a plurality of sub-circuits such as an error correction code (ECC) and randomizer circuit 114E and a table and data-refresh (DR) control circuit 114TD (respectively labeled "ECC & randomizer circuit" and "Table & DR control circuit" in FIG. 1, for brevity), but the present invention is not limited thereto. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, Universal Flash Storage (UFS) specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programing, etc. on memory units (e.g. data pages) having physical addresses within the flash memory 120, where the physical addresses correspond to the logical addresses. When the memory controller 110 perform an erase operation on any NV memory element 122-$n$ of the plurality of NV memory elements 122-1, 122-2, . . . , and 122-N (in which "n" may represent any integer in the interval [1, N]), at least one block of multiple blocks of the NV memory element 122-$n$ may be erased, where each block of the blocks may comprise multiple pages (e.g. data pages), and an access operation (e.g. reading or writing) may be performed on one or more pages.

II. NV Memory Architecture

Figure 2:
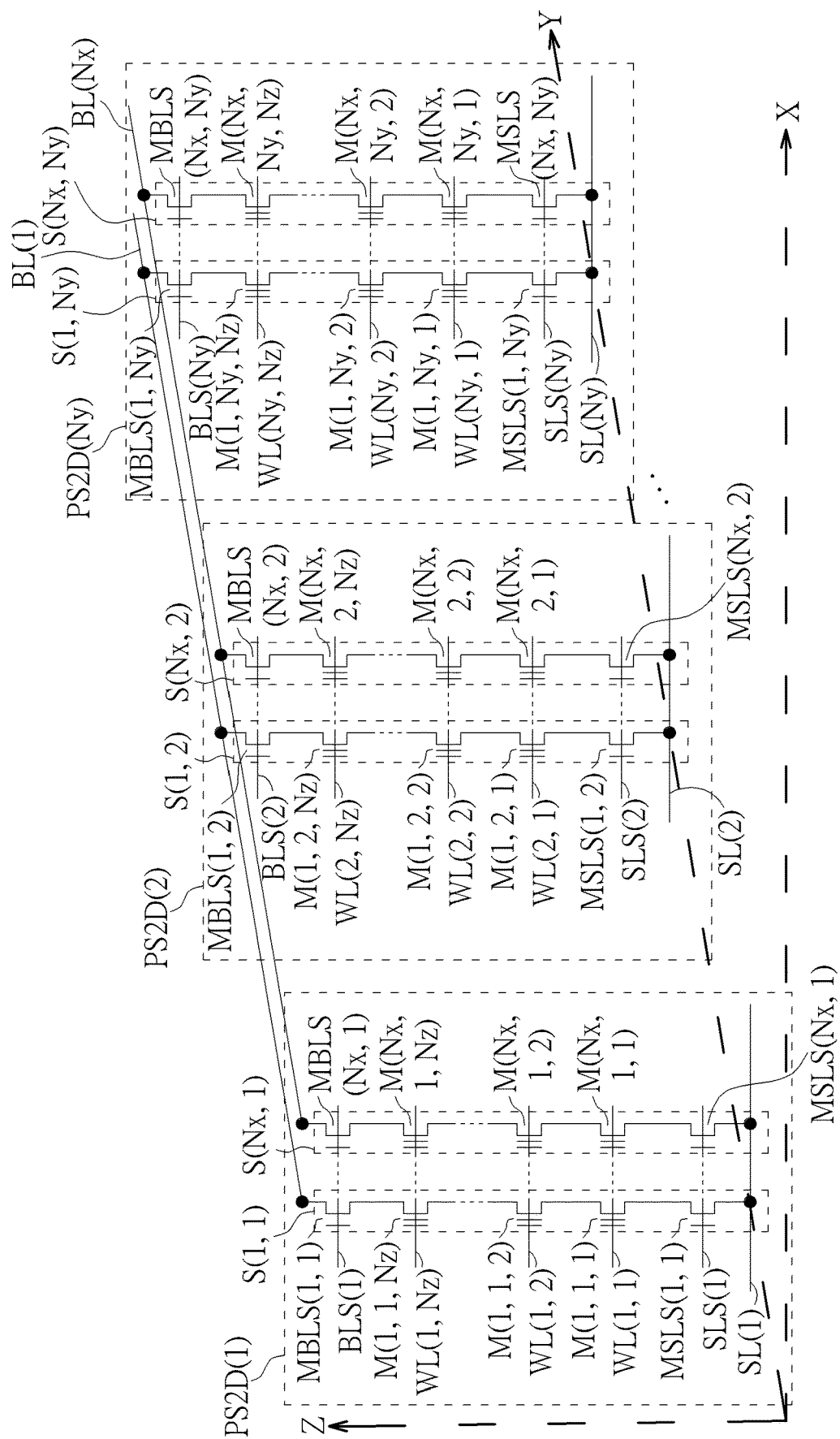
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one NV memory element (e.g. the one or more NV memory elements), such as each memory element within the plurality of NV memory elements 122-1, 122-2, . . . , and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), . . . , M(Nx, 1, 1)}, {M(1, 2, 1), . . . , M(Nx, 2, 1)}, . . . , {M(1, Ny, 1), . . . , M(Nx, Ny, 1)}}, {{M(1, 1, 2), . . . , M(Nx, 1, 2)}, {M(1, 2, 2), . . . , M(Nx, 2, 2)}, . . . , {M(1, Ny, 2), . . . , M(Nx, Ny, 2)}}, . . . , and {{M(1, 1, Nz), M(Nx, 1, Nz)}, {M(1, 2, Nz), M(Nx, 2, Nz)}, . . . , {M(1, Ny, Nz), M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), . . . , MBLS(Nx, 1)}, {MBLS(1, 2), . . . , MBLS (Nx, 2)}, . . . , and {MBLS(1, Ny), MBLS(Nx, Ny)} that are arranged in an upper layer above the Nz layers and (Nx*Ny) lower selector circuits {MSLS(1, 1), . . . , MSLS(Nx, 1)}, {MSLS(1, 2), . . . , MSLS(Nx, 2)}, . . . , and {MSLS(1, Ny), MSLS(Nx, Ny)} that are arranged in a lower layer below the Nz layers. In addition, the 3D NAND flash memory may comprise a plurality of bit lines and a plurality of word lines for access control, such as Nx bit lines BL(1), . . . , and BL(Nx) that are arranged in a top layer above the upper layer and (Ny*Nz) word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), WL(Ny, Nz)} that are respectively arranged in the Nz layers. Additionally, the 3D NAND flash memory may comprise a plurality of selection lines for selection control, such as Ny upper selection lines BLS(1), BLS(2), ..., and BLS(Ny) that are arranged in the upper layer and Ny lower selection lines SLS(1), SLS(2), ..., and SLS(Ny) that are arranged in the lower layer, and may further comprise a plurality of source lines for providing reference levels, such as Ny source lines SL(1), SL(2), ..., and SL(Ny) that are arranged in a bottom layer below the lower layer.

As shown in FIG. 2, the 3D NAND flash memory may be divided into Ny circuit modules PS2D(1), PS2D(2), ..., and PS2D(Ny) distributed along the Y-axis. For better comprehension, the circuit modules PS2D(1), PS2D(2), ..., and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), ..., and PS2D(Ny) may comprise Nx secondary circuit modules S(1, ny), ..., and S(Nx, ny), where "ny" may represent any integer in the interval [1, Ny]. For example, the circuit module PS2D(1) may comprise Nx secondary circuit modules S(1, 1), ..., and S(Nx, 1), the circuit module PS2D(2) may comprise Nx secondary circuit modules S(1, 2), ..., and S(Nx, 2), ..., and the circuit module PS2D(Ny) may comprise Nx secondary circuit modules S(1, Ny), ..., and S(Nx, Ny). In the circuit module PS2D(ny), any secondary circuit module S(nx, ny) of the secondary circuit modules S(1, ny), and S(Nx, ny) may comprise Nz memory cells M(nx, ny, 1), M(nx, ny, 2), ..., and M(nx, ny, Nz), and may comprise a set of selector circuits corresponding to the memory cells M(nx, ny, 1), M(nx, ny, 2), ..., and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), ..., and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), ..., and M(nx, ny, Nz) may be implemented with a floating gate transistor, where "nz" may represent any integer in the interval [1, Nz], but the present invention is not limited thereto. For example, the memory cell M(nx, ny, nz) may be implemented with a charge-trap (CT) transistor using CT materials. Further, the upper selector circuits MBLS(1, ny), ..., and MBLS(Nx, ny) in the circuit module PS2D(ny) may perform selection according to the selection signal on the corresponding selection line BLS(ny), and the lower selector circuits MSLS(1, ny), ..., and MSLS(Nx, ny) in the circuit module PS2D(ny) may perform selection according to the selection signal on the corresponding selection line SLS(ny).

Figure 3:
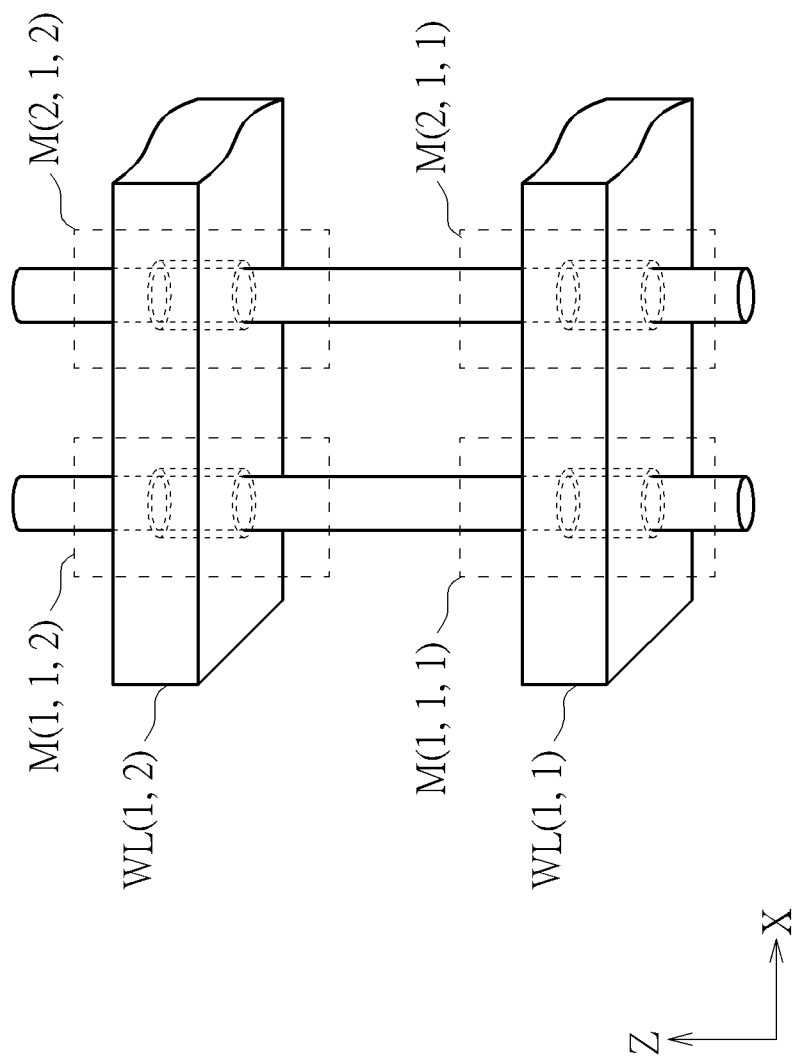
FIG. 3 illustrates some partial structures of the 3D NAND flash memory shown in FIG. 2 according to an embodiment of the present invention.

FIG. 3 illustrates some partial structures of the 3D NAND flash memory shown in FIG. 2 according to an embodiment of the present invention. The 3D NAND flash memory may be designed to have a plurality of rod-shaped partial structures such as that shown in FIG. 3, and the plurality of rod-shaped partial structures may be arranged to pass through the secondary circuit modules {S(1, 1), ..., S(Nx, 1)}, {S(1, 2), ..., S(Nx, 2)}, ..., and {S(1, Ny), S(Nx, Ny)}, respectively. For better comprehension, the plurality of rod-shaped partial structures may be regarded as the channels of the associated transistors of the secondary circuit modules {S(1, 1), ..., S(Nx, 1)}, {S(1, 2), ..., S(Nx, 2)}, ..., and {S(1, Ny), S(Nx, Ny)} within the architecture shown in FIG. 2, respectively, such as the channels of the ordinary transistors for implementing the upper selector circuit MBLS(nx, ny) and the lower selector circuit MSLS (nx, ny) and the channel of the floating gate transistor for implementing the memory cell M(nx, ny, nz). According to some embodiments, the number of the plurality of rod-shaped partial structures may be equal to the total amount (Nx*Ny) of the secondary circuit modules {S(1, 1), ..., S(Nx, 1)}, {S(1, 2), ..., S(Nx, 2)}, ..., and {S(1, Ny), S(Nx, Ny)}, but the present invention is not limited thereto. For example, the arrangement of the plurality of memory cells may be changed, and the number of the plurality of rod-shaped partial structures may be changed correspondingly.

In addition, the 3D NAND flash memory may be designed to have a plurality of pipe-shaped partial structures, and the plurality of pipe-shaped partial structures may be arranged to encircle the plurality of rod-shaped partial structures to form the respective components of the secondary circuit modules {S(1, 1), ..., S(Nx, 1)}, {S(1, 2), ..., S(Nx, 2)}, ..., and {S(1, Ny), S(Nx, Ny)}, and more particularly, to form the respective control gates and the respective floating gates of the plurality of memory cells and the respective gates of the plurality of selector circuits in the architecture shown in FIG. 2. The memory cells {{M(1, 1, 1), M(2, 1, 1), ...}, {M(1, 1, 2), M(2, 1, 2), ...}, ...} and the word lines {WL(1, 1), WL(1, 2), ...} are illustrated in FIG. 3, and the pipe-shaped partial structures shown in FIG. 3 may indicate that there are some additional partial structures surrounding each of the plurality of rod-shaped partial structures, where further details regarding the additional partial structures will be described in the following embodiments.

Figure 4:
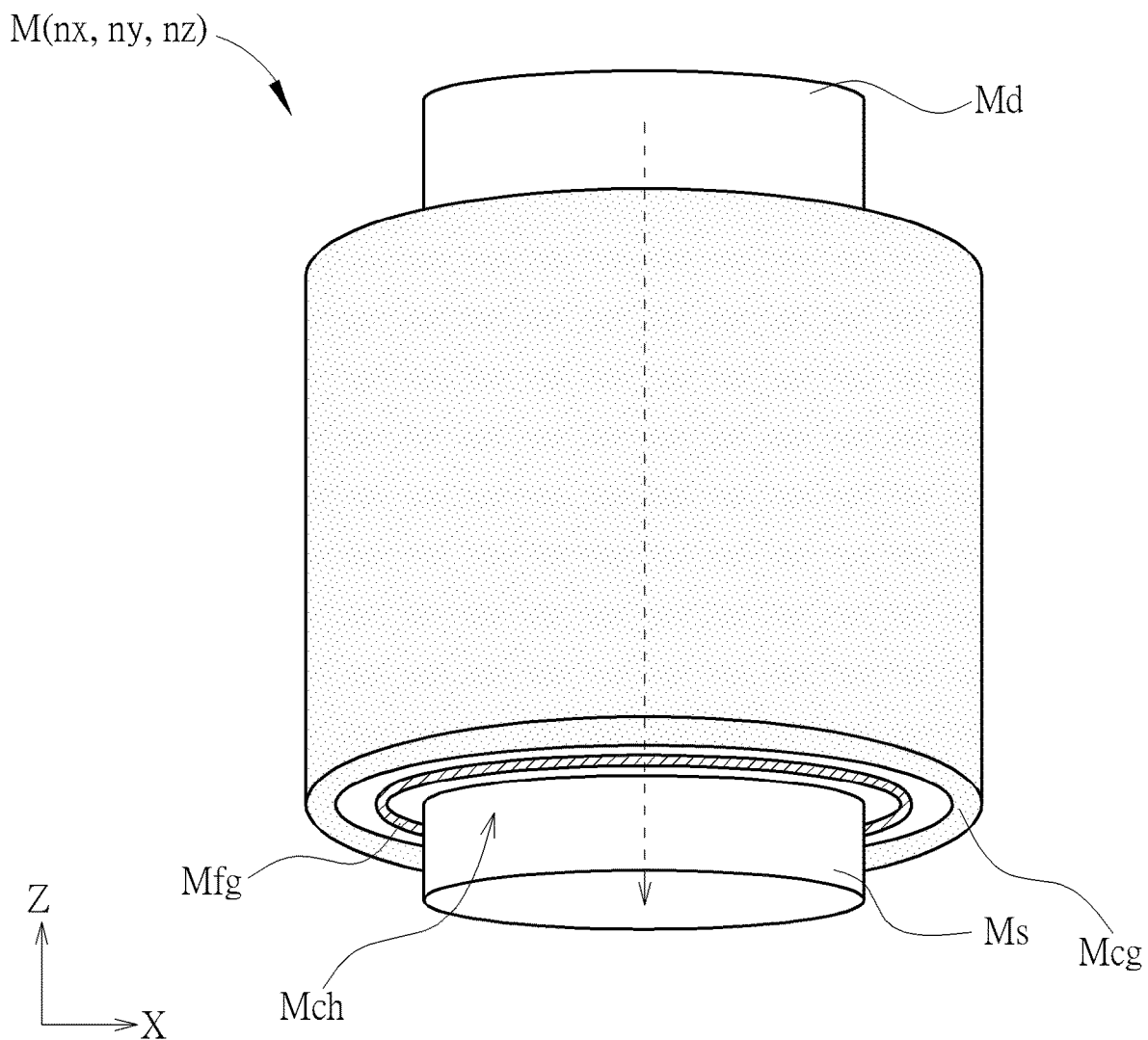
FIG. 4 illustrates some implementation details of one of the memory cells of the 3D NAND flash memory shown in FIG. 2 according to an embodiment of the present invention.

FIG. 4 illustrates some implementation details of one of the memory cells of the 3D NAND flash memory shown in FIG. 2 according to an embodiment of the present invention. As shown in FIG. 4, the memory cell M(nx, ny, nz) may comprise a portion of one of the plurality of rod-shaped partial structures, such as a rod segment within the rod-shaped partial structure corresponding to the secondary circuit module S(nx, ny), and may further comprise some pipe-shaped partial structures having the same symmetry axis. For example, the upper side Md and the lower side Ms of the rod segment may be utilized as the drain and the source of the floating gate transistor for implementing the memory cell M(nx, ny, nz), and a first pipe-shaped partial structure Mfg and a second pipe-shaped partial structure Mcg within these pipe-shaped partial structures may be utilized as the floating gate and the control gate of this floating gate transistor. The other pipe-shaped partial structures within these pipe-shaped partial structures, such as the pipe-shaped partial structure between the rod segment and the first pipe-shaped partial structure Mfg and the pipe-shaped partial structure between the first pipe-shaped partial structure Mfg and the second pipe-shaped partial structure Mcg, may be implemented with one or more insulation materials.

According to some embodiments, any selector circuit of the plurality of selector circuits in the architecture shown in FIG. 2 may be implemented by altering the architecture shown in FIG. 4. For example, the upper side Md and the lower side Ms of the rod segment may be utilized as the drain and the source of the ordinary transistor for implementing this selector circuit, and the second pipe-shaped partial structure Mcg within these pipe-shaped partial structures may be utilized as the gate of the ordinary transistor, where the first pipe-shaped partial structure Mfg should be removed from the one or more insulation materials. As a result, there may be only one pipe-shaped partial structure between the rod segment and the second pipe-shaped partial structure Mcg, but the present invention is not limited thereto.

III. Flash Memory Basic Characteristics Measurement

According to some embodiments, the memory controller 110 may utilize the ECC and randomizer circuit 114E to perform randomizing and ECC encoding during writing, and perform ECC decoding and de-randomizing during reading. For example, the memory controller 110 may utilize the ECC and randomizer circuit 114E to perform randomizing and then perform ECC encoding during writing, and to perform ECC decoding and then perform de-randomizing during reading. For another example, the memory controller 110 may utilize the ECC and randomizer circuit 114E to perform ECC encoding and then perform randomizing during writing, and to perform de-randomizing and then perform ECC decoding during reading. More particularly, the ECC and randomizer circuit 114E may comprise an ECC encoder and an ECC decoder that are arranged to perform ECC encoding operations and ECC decoding operations, respectively, and may further comprise a randomizer and a de-randomizer that are arranged to perform randomizing operations and de-randomizing operations, respectively, but the present invention is not limited thereto. As a result of randomizing, probabilities of the 0 and 1 bits in the NV memory 120 may be similar or equal to each other.

The charge distribution of the memory cells within the NV memory 120 may be illustrated with a threshold voltage (Vth)-distribution plot, and may correspond to bits per memory cell, where the threshold voltage (Vth) may be arranged to detect the bit information stored in the memory cells, and may be referred to as a sensing voltage or a read voltage (more particularly, a read point regarding voltage) according to some viewpoints. For example, a TLC Vth-distribution plot for TLC memory cells may have a shape of 8 mountain-like portions (e.g. $2^3=8$), and a QLC Vth-distribution plot for QLC memory cells may have a shape of 16 mountain-like portions (e.g. $2^4=16$).

Figure 5:
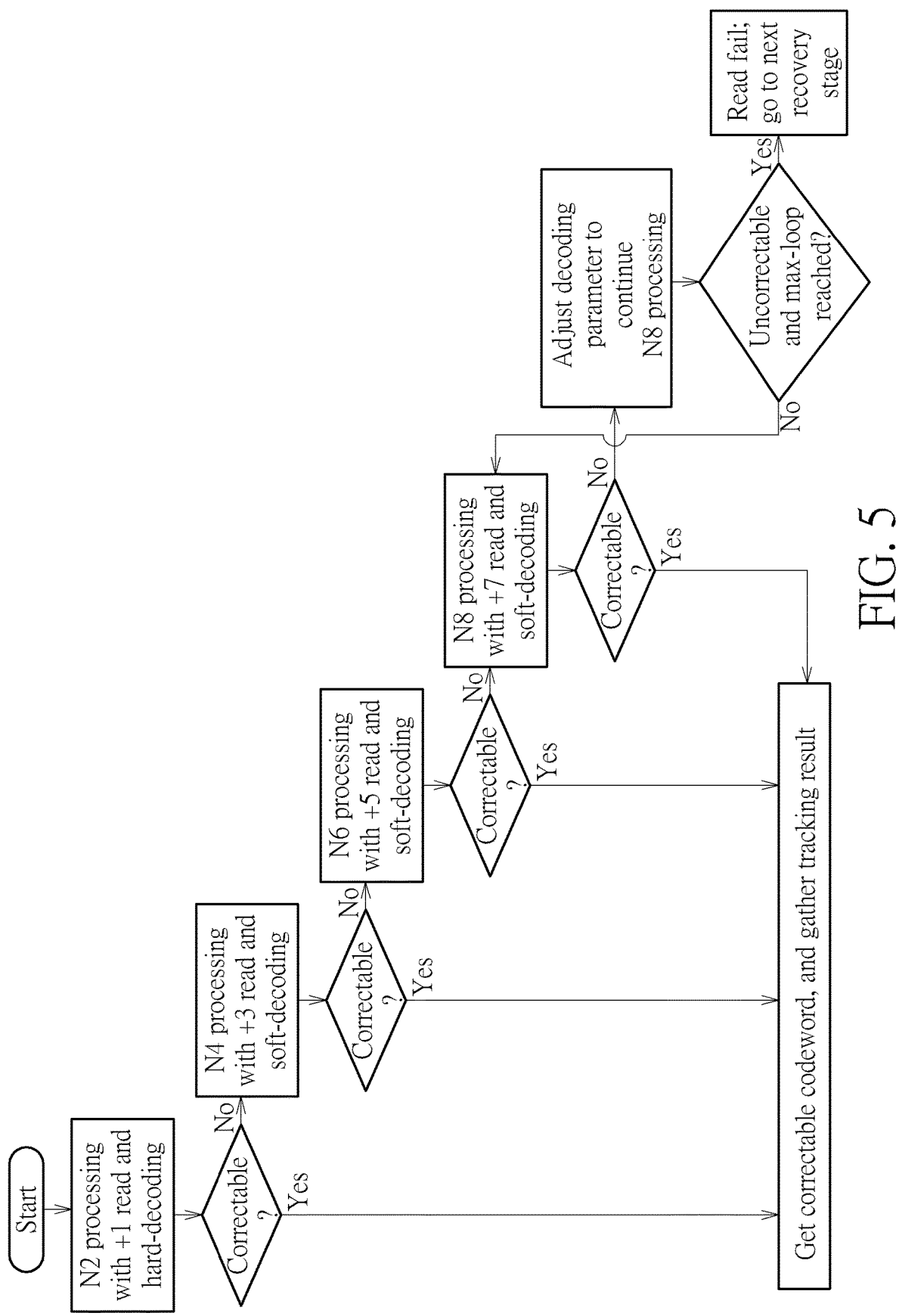
FIG. 5 illustrates a threshold voltage (Vth)-tracking control scheme according to an embodiment of the present invention.
Figure 6:
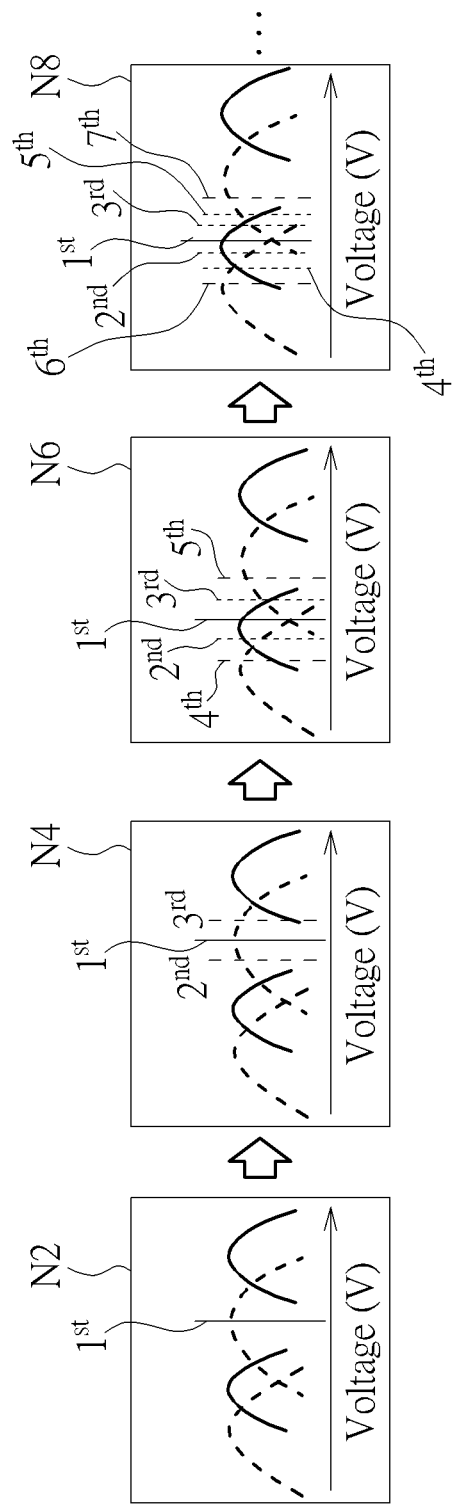
FIG. 6 illustrates some implementation details of the Vth-tracking control scheme shown in FIG. 5.

FIG. 5 illustrates a Vth-tracking control scheme according to an embodiment of the present invention, and FIG. 6 illustrates some implementation details of the Vth-tracking control scheme shown in FIG. 5. In the working flow shown in FIG. 5, the memory controller 110 may try sequentially performing N2 processing, N4 processing, N6 processing, and N8 processing (respectively labeled "N2", "N4", "N6", and "N8" in FIG. 6, for brevity) until certain condition (e.g. correctable, uncorrectable, etc.) is satisfied. For example, the memory controller 110 may utilize one or more ECC circuits (e.g. one or more ECC engines) within the ECC and randomizer circuit 114E to perform ECC decoding such as at least one portion (e.g. a portion or all) of decoding in the N2 processing, the N4 processing, the N6 processing, and the N8 processing, but the present invention is not limited thereto. When the execution of the working flow reaches the N2 processing, the memory controller 110 may have tried with one candidate read voltage of the threshold voltage (Vth) (e.g. the $1^{st}$ candidate read voltage shown in FIG. 6), and this may take one flash read busy time tR (e.g. 100 microseconds (μs) to 200 μs). When the execution of the working flow reaches the N4 processing, the memory controller 110 may have tried with three candidate read voltages of the threshold voltage (Vth) (e.g. the $1^{st}$, the $2^{nd}$, and the $3^{rd}$ candidate read voltages shown in FIG. 6), and this may take three flash read busy time tR (e.g. (3*100) μs to (3*200) μs, i.e. 300 μs to 600 μs). When the execution of the working flow reaches the N6 processing, the memory controller 110 may have tried with five candidate read voltages of the threshold voltage (Vth) (e.g. the $1^{st}$, the $2^{nd}$, the $3^{rd}$, the $4^{th}$, and the $5^{th}$ candidate read voltages shown in FIG. 6), and this may take five flash read busy time tR (e.g. (5*100) μs to (5*200) μs, i.e. 500 μs to 1000 μs). When the execution of the working flow reaches the N8 processing, the memory controller 110 may have tried with seven candidate read voltages of the threshold voltage (Vth) (e.g. the $1^{st}$, the $2^{nd}$, the $3^{rd}$, the $4^{th}$, the $5^{th}$, the $6^{th}$, and the $7^{th}$ candidate read voltages shown in FIG. 6), and this may take seven flash read busy time tR (e.g. (7*100) μs to (7*200) μs, i.e. 700 μs to 1400 μs).

The memory controller 110 may perform the N2 processing with bit information of the $1^{st}$ candidate read voltage (labeled "+1 read" in FIG. 5, for brevity) and hard-decoding, and check whether the codeword is correctable, where the case of no error may be regarded as correctable. If yes, the step at the lower left corner is entered; if no, the N4 processing is triggered. The memory controller 110 may perform the N4 processing with bit information of the $1^{st}$, the $2^{nd}$, and the $3^{rd}$ candidate read voltages (labeled "+3 read" in FIG. 5, for brevity) and soft-decoding, and check whether the codeword is correctable, where this bit information may comprise one sign bit and one soft bit. If yes, the step at the lower left corner is entered; if no, the N6 processing is triggered. The memory controller 110 may perform the N6 processing with bit information of the $1^{st}$, the $2^{nd}$, the $3^{rd}$, the $4^{th}$, and the $5^{th}$ candidate read voltages (labeled "+5 read" in FIG. 5, for brevity) and soft-decoding, and check whether the codeword is correctable, where this bit information may comprise one sign bit and two soft bits. If yes, the step at the lower left corner is entered; if no, the N8 processing is triggered. The memory controller 110 may perform the N8 processing with bit information of the $1^{st}$, the $2^{nd}$, the $3^{rd}$, the $4^{th}$, the $5^{th}$, the $6^{th}$, and the $7^{th}$ candidate read voltages (labeled "+7 read" in FIG. 5, for brevity) and soft-decoding, and check whether the codeword is correctable, where this bit information may comprise one sign bit and two soft bits. If yes, the step at the lower left corner is entered; if no, the memory controller 110 may adjust one or more decoding parameters of the one or more ECC circuits to continue the N8 processing. For example, the memory controller 110 may try various combinations of decoding parameters for the N8 processing, and check whether the codeword is correctable. Examples of the decoding parameters may include, but are not limited to: sensing step size, decoder internal coefficient, and some parameters regarding dynamically tuning the LLR. If the codeword is uncorrectable and the number of times of executing the loop of the N8 processing reaches a predetermined number such as the maximum loop number (labeled "max-loop reached" in FIG. 5, for brevity), the memory controller 110 may determine that a read fail occurs, and go to the next recovery stage; otherwise, the memory controller 110 may continue the N8 processing. In the step at the lower left corner, the memory controller 110 may get a correctable codeword, and gather the tracking results. For example, the tracking results may comprise the candidate read voltages that have been tried, such as the vertical lines illustrated in the N2 processing, the N4 processing, the N6 processing, and the N8 processing shown in FIG. 6, where the vertical lines may be labeled "$1^{st}$", "$2^{nd}$", "$3^{rd}$", "$4^{th}$", "$5^{th}$", "$6^{th}$", and "$7^{th}$" to indicate the $1^{st}$, the $2^{nd}$, the $3^{rd}$, the $4^{th}$, the $5^{th}$, the $6^{th}$, and the $7^{th}$ candidate read voltages, respectively.

Figure 7:
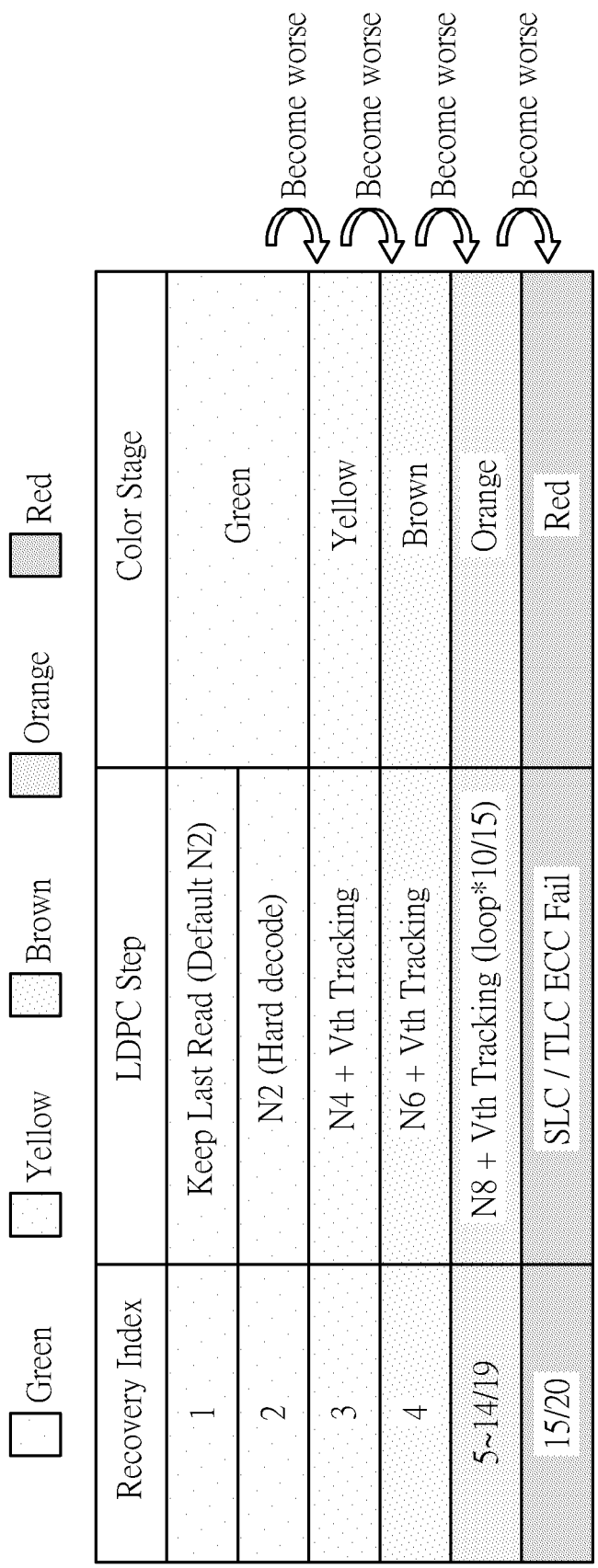
FIG. 7 illustrates some recovery stages of the Vth-tracking control scheme shown in FIG. 5 and the relationships between the recovery stages according to an embodiment of the present invention.

FIG. 7 illustrates some recovery stages of the Vth-tracking control scheme shown in FIG. 5 and the relationships between the recovery stages according to an embodiment of the present invention, where low-density parity-check (LDPC) decoding may be taken as an example of the ECC decoding. The total number (e.g. N_max-index such as 15 or 20) of recovery indexes 1, 2, 3, 4, 5, etc. may correspond to the maximum loop number (e.g. N_max-loop such as 10 or 15). When the memory controller 110 keeps the last read voltage by default in the N2 processing to obtain the correctable codeword directly or performs hard-decoding in the N2 processing to obtain the correctable codeword, the color stage of the ECC decoding may be regarded as Green, which may indicate the best case. When the memory controller 110 perform the N4 processing with Vth tracking to obtain the correctable codeword, the color stage of the ECC decoding may be regarded as Yellow. When the memory controller 110 perform the N6 processing with Vth tracking to obtain the correctable codeword, the color stage of the ECC decoding may be regarded as Brown. When the memory controller 110 perform the N8 processing with Vth tracking to obtain the correctable codeword, for example, by executing the loop of the N8 processing multiple times within the maximum loop number (e.g. N_max-loop such as 10 or 15), the color stage of the ECC decoding may be regarded as Orange. When SLC or TLC ECC fail occurs, for example, the step at the lower right corner shown in FIG. 5 is entered, the color stage of the ECC decoding may be regarded as Red, which may indicate the worst case. As the N2 processing corresponds to the recovery indexes 1 and 2, and as the N4 processing and the N6 processing correspond to the recovery indexes 3 and 4, respectively, the N8 processing may correspond to the recovery indexes {5, 6, . . . , (N_max-index-1)} (e.g. {5, 6, . . . , 14} or {5, 6, . . . , 19}), and the SLC or TLC ECC fail may correspond to the recovery index N_max-index (e.g. 15 or 20), where N_max-index=(4+N_max-loop+1)=(N_max-loop+5).

Figure 8:
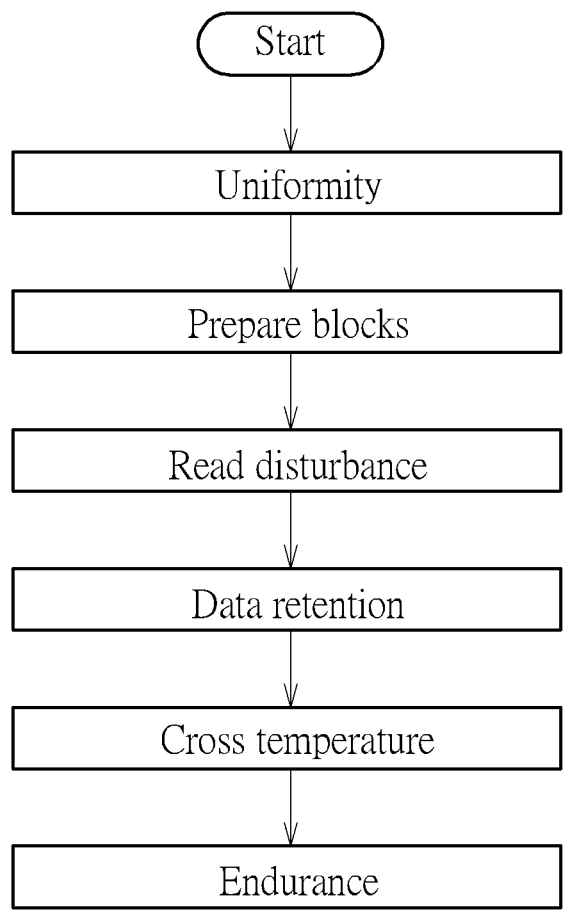
FIG. 8 illustrates a test flow of the Vth-tracking control scheme shown in FIG. 5 according to an embodiment of the present invention.

FIG. 8 illustrates a test flow of the Vth-tracking control scheme shown in FIG. 5 according to an embodiment of the present invention. According to this embodiment, a production tool such as another host device (e.g. a personal computer such as a desktop computer and a laptop computer) may perform the test flow, and the plurality of samples may be installed at a plurality of memory devices having the same product model number as that of the memory device 100, but the present invention is not limited thereto. For example, the plurality of samples may represent a plurality of NV memories having the same product model number as that of the NV memory 120. For another example, the plurality of samples may represent a set of NV memory elements having the same product model number as that of the plurality of NV memory elements 122-1, 122-2, . . . , and 122-N.

The test flow may comprise a series of test procedures such as Uniformity, Prepare blocks, Read disturbance, Data retention, Cross temperature, and Endurance, for testing a plurality of samples. In the test procedure of Uniformity, the production tool may test the uniformity of basic states of the samples, where the program and erase (P/E) cycle may be equal to five or another value. In the test procedure of Prepare blocks, the production tool may prepare blocks of program and erase (P/E) groups of 1, 150, 500, 1000, 1500, 3000, 5000, and 10000 cycles. In the test procedure of Read disturbance, the production tool may test by reading, for example, whole block read and single page read. In the test procedure of Data retention, the production tool may test the data retention of the samples with various lengths of time such as 0, 2, 4, 6, 8, 16, 20, and 24 hours at 100° C. In the test procedure of Cross temperature, the production tool may test the samples with various temperature values such as that in a temperature range of 0° C. to 70° C. In the test procedure of Endurance, the production tool may test the endurance of the samples in SLC and TLC modes, respectively. As a result, the production tool may detect operation ranges of the plurality of samples. Regarding any sample of the plurality of samples, the operation ranges may correspond to a combination of the sample and the controller integrated circuit (IC) (more particularly, an ECC circuit and a signal processing module therein) coupled to the sample. The production tool may utilize the operation ranges as measurement results regarding quality of service (QoS).

According to some embodiments, the production tool mentioned above may be referred to as a first production tool, and at least one portion (e.g. a portion or all) of the plurality of samples may be installed at a second production tool coupled to the first production tool, such as another memory device having the same product model number as that of the memory device 100, and the other memory device may have a modified architecture (e.g. one or more sockets, etc.) for installing the aforementioned at least one portion of the plurality of samples.

Figure 9:
FIG. 9 illustrates some test results obtained through the test flow shown in FIG. 8 according to an embodiment of the present invention.

FIG. 9 illustrates some test results obtained through the test flow shown in FIG. 8 according to an embodiment of the present invention. As shown in FIG. 9, testing the endurance may vary with respect to program and erase (P/E) cycle (e.g. 1, 150, 500, 1000, 1500, 3000, 5000, and 10000 cycles) in the vertical direction, and testing the data retention may vary with respect to time (e.g. 0, 2, 4, 6, 8, 16, 20, and 24 hours at 100° C.) in the horizontal direction. Different degrees of shadings may be arranged to indicate the respective maximum recovery index that has been reached. The percentages may indicate the N2 trigger rate, such as the rate of merely triggering the N2 processing (rather than the N4 processing, the N6 processing, and the N8 processing). For enterprise users, the requirement of the N2 trigger rate may be defined as 99.99% for a set of predetermined conditions (e.g. the endurance cycle of 10000, the data retention of three months at 55° C., etc.), but the present invention is not limited thereto. Based on this requirement, the data should be correctly returned to the host side within one flash read busy time tR (e.g. a read delay of 0.1 milliseconds (ms) to 0.2 ms) for the condition of baking 2 hours at 100° C. Therefore, optimizing the associated operation ranges having the N2 trigger rate that is less than 99.9% may be required.

Figure 10:
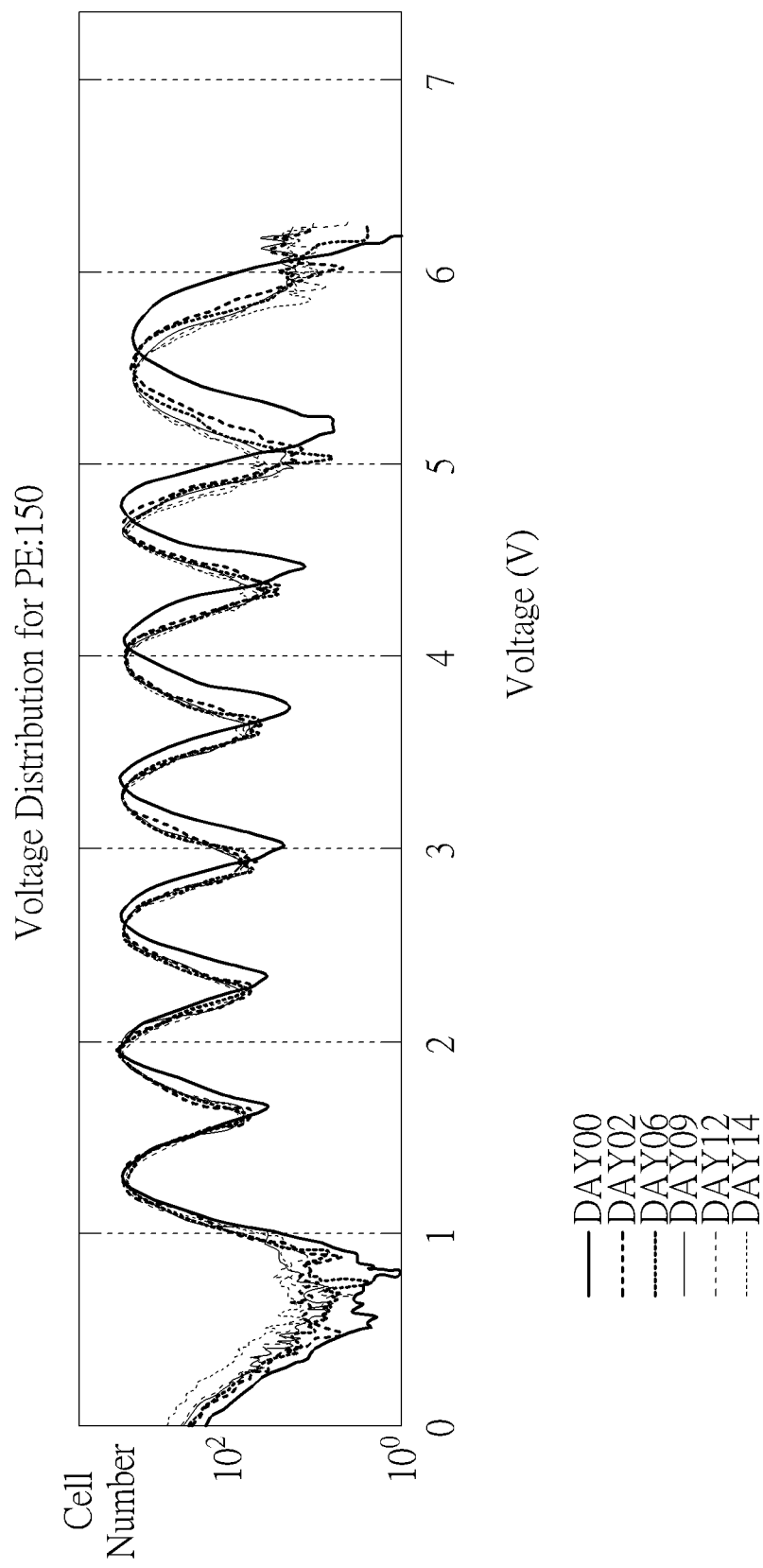
FIG. 10 illustrates a TLC Vth-distribution plot for a certain endurance cycle such as 150 cycles of program and erase (P/E) according to an embodiment of the present invention.
Figure 11:
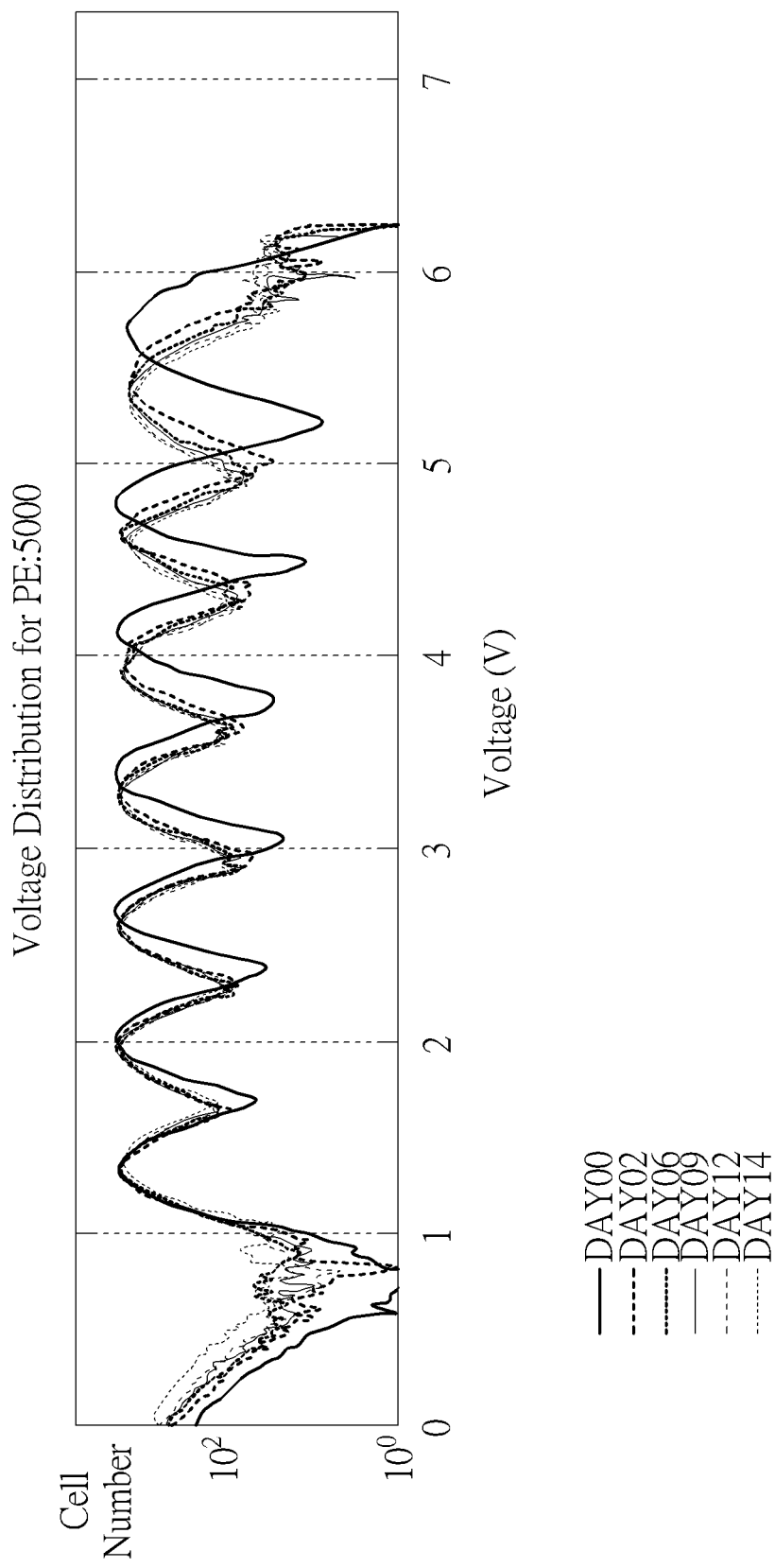
FIG. 11 illustrates a TLC Vth-distribution plot for a higher endurance cycle such as 5000 cycles of program and erase (P/E) according to the embodiment shown in FIG. 10.

FIG. 10 illustrates a TLC Vth-distribution plot for a certain endurance cycle such as 150 cycles of program and erase (P/E) according to an embodiment of the present invention, and FIG. 11 illustrates a TLC Vth-distribution plot for a higher endurance cycle such as 5000 cycles of program and erase (P/E) in this embodiment, where the two TLC Vth-distribution plots correspond to room temperature data retention. The legend of DAY00, DAY02, DAY06, DAY09, DAY12, and DAY14 may correspond to a series of time points {0, 2, 6, 9, 12, 14} along the time axis, in unit of day or 24 hours. When the program and erase (P/E) cycle reaches 150 (labeled "PE: 150" in FIG. 10, for brevity), the maximum or greater shifting amounts of Vth shifting may occur within the first two days, and then the Vth shifting may gradually reach a saturation status. When the program and erase (P/E) cycle reaches 5000 (labeled "PE: 5000" in FIG.

11, for brevity), the maximum or greater shifting amounts of Vth shifting may occur within the first two days, and then the Vth shifting may gradually reach a saturation status. According to this embodiment, the error correction capability of the ECC circuit of the memory controller 110 is sufficient for covering the Vth shifting in the two TLC Vth-distribution plots, and more particularly, through the N2 processing, having no need to perform any processing within the N4 processing, the N6 processing, and the N8 processing.

IV. Background Scan Mechanism

Figure 12:
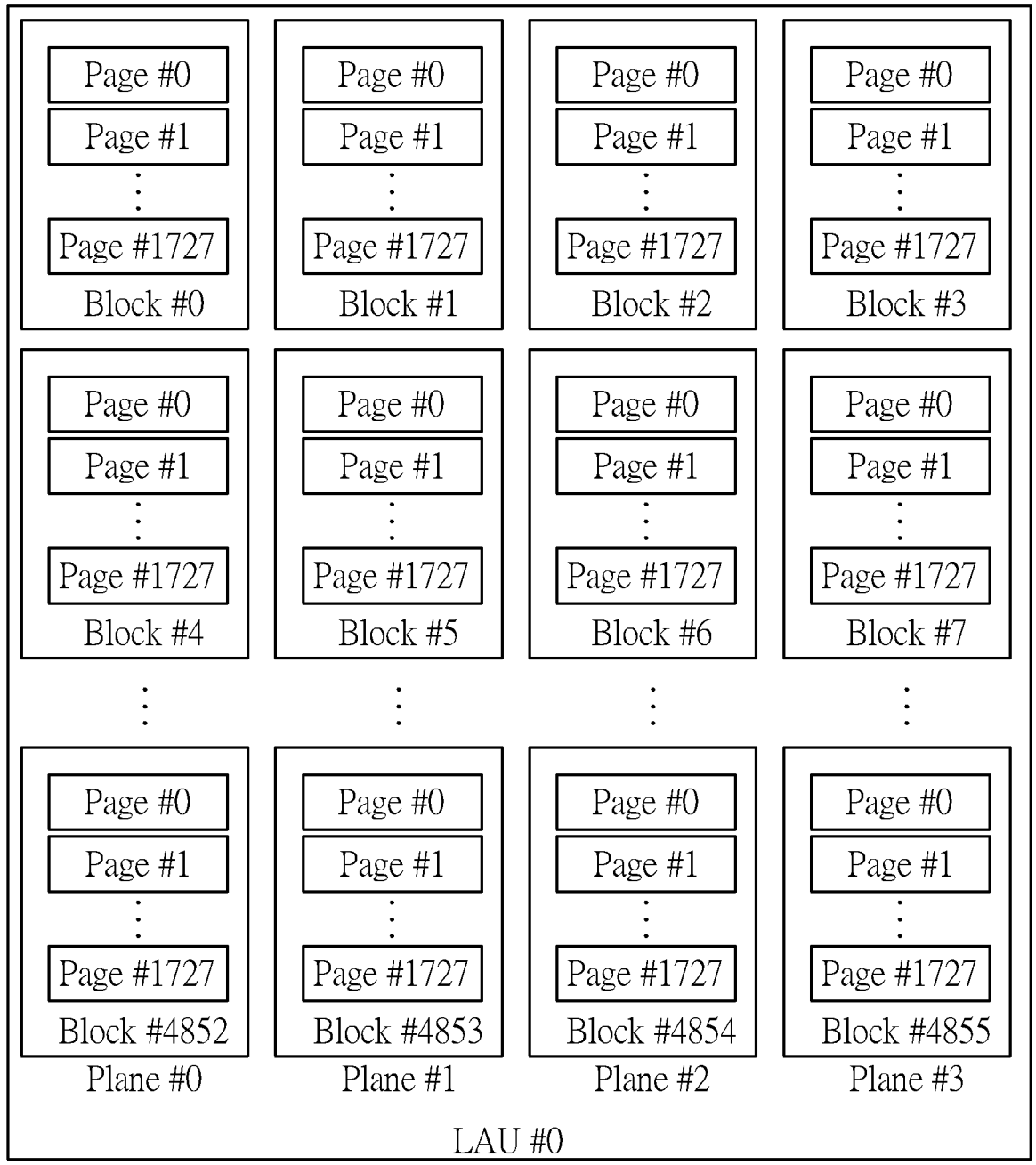
FIG. 12 illustrates some physical blocks processed with a background scan control scheme according to an embodiment of the present invention.

FIG. 12 illustrates some physical blocks processed with a background scan control scheme according to an embodiment of the present invention. According to this embodiment, the memory controller 110 may perform background scan on the NV memory 120 to read one or more pages of the pages #1, #2, ..., and #1727 in each block of the blocks #1, #2, ..., and #4855 in each logical access unit (LAU) (e.g. LAU #0) of a plurality of LAUs #0, #1, etc., where the columns of blocks shown in FIG. 12 belong to the planes #0, #1, #2, and #3 of this LAU (e.g. LAU #0), respectively. The memory controller 110 may perform the background scan in a time division manner, and more particularly, may read a few amount of data each time and complete the background scan once within a predetermined length of time (e.g. 14 days). For example, the memory controller 110 may read one page in each block within each LAU of the plurality of LAUs #0, #1, etc., and the page number of the next block to be read may be different from the page number of the current block to be read, but the present invention is not limited thereto. For example, all data may be read once within the predetermined length of time (e.g. 14 days).

During the background scan, the memory controller 110 may collect (e.g. record) valley information of the valleys (e.g. the valley-like portions between the mountain-like portions) of the Vth-distribution of the NV memory 120, to optimize the read voltages, for being used when reading. More particularly, when one or more errors occur, the memory controller 110 may collect (e.g. record) the error bit number per ECC chunk, and may further perform Vth-tracking to determine the best read voltages.

Figure 13:
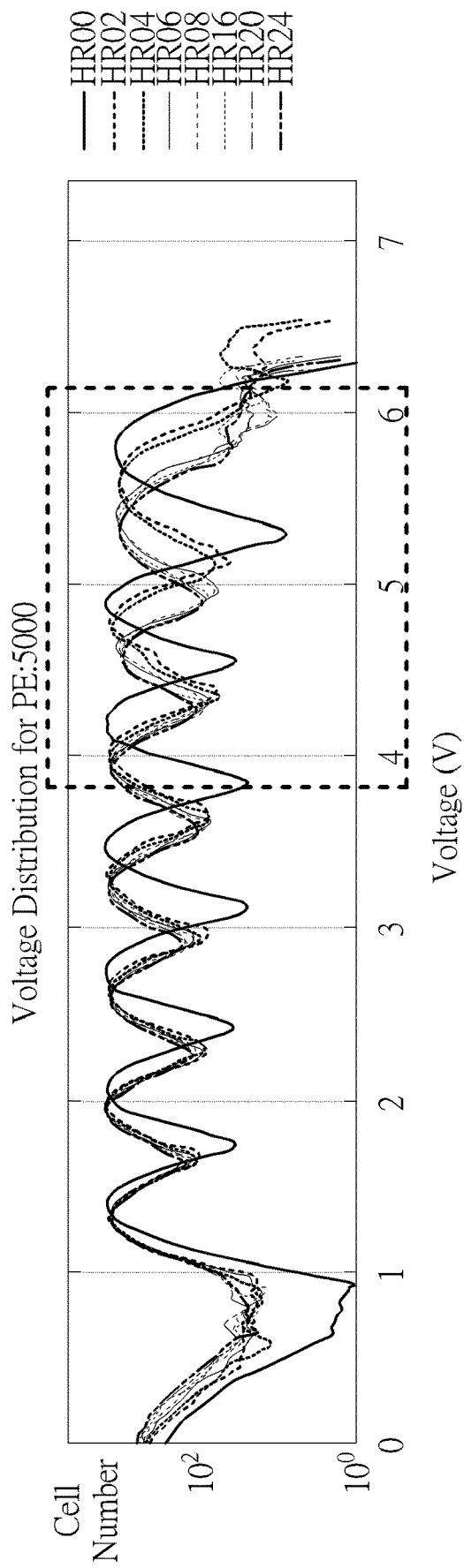
FIG. 13 illustrates a TLC Vth-distribution plot regarding a noise margin recording control scheme according to an embodiment of the present invention.
Figure 14:
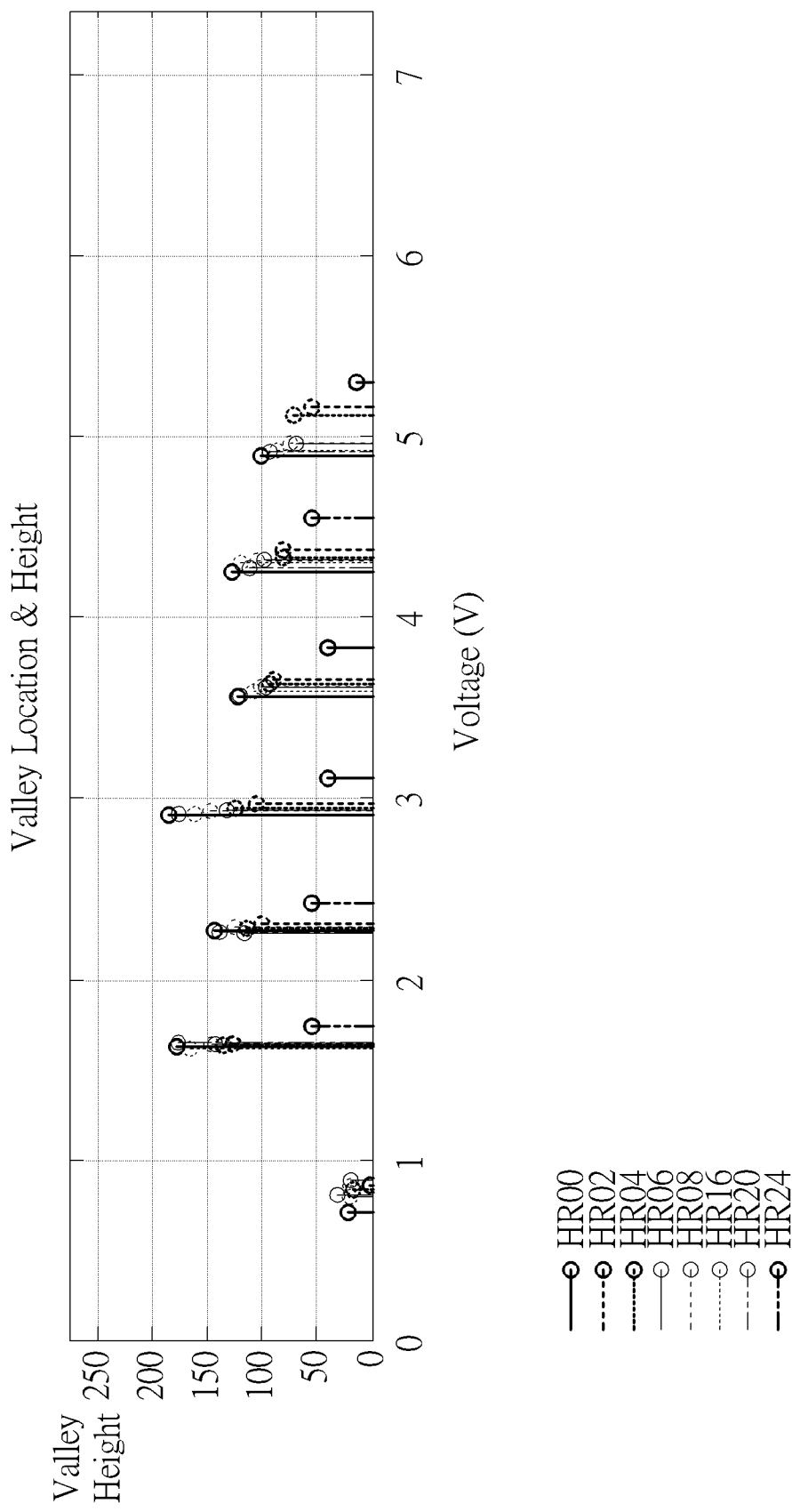
FIG. 14 illustrates a valley location and height plot corresponding to the TLC Vth-distribution plot shown in FIG. 13.
Figure 15:
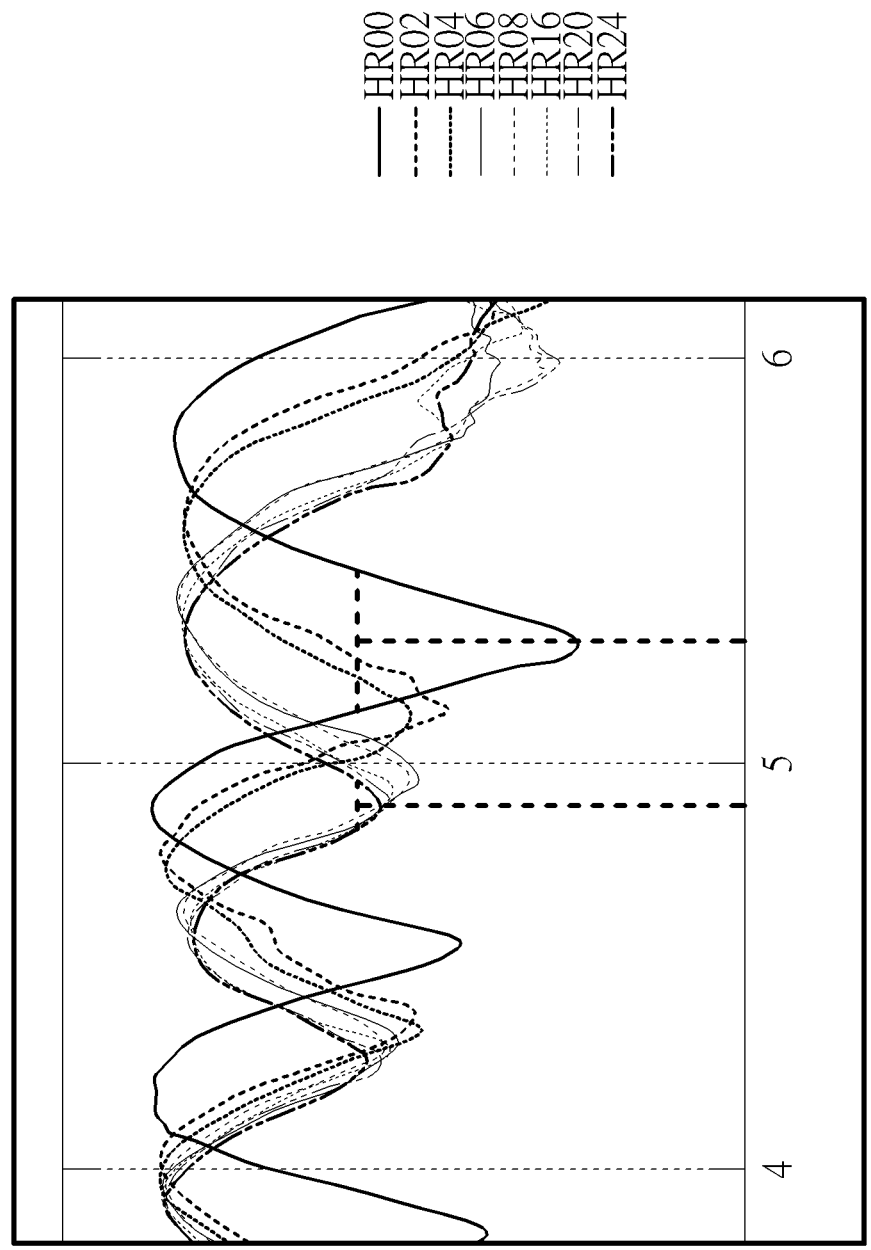
FIG. 15 illustrates some hard-decoding pass ranges of a portion of valleys in the TLC Vth-distribution plot shown in FIG. 13.

FIG. 13 illustrates a TLC Vth-distribution plot regarding a noise margin recording control scheme according to an embodiment of the present invention, FIG. 14 illustrates a valley location and height plot corresponding to the TLC Vth-distribution plot shown in FIG. 13, and FIG. 15 illustrates some hard-decoding pass ranges of a portion of valleys in the TLC Vth-distribution plot shown in FIG. 13 (e.g. the valleys within the block illustrated with dashed lines in FIG. 13), where the program and erase (P/E) cycle may be 5000 (labeled "PE: 5000" in FIG. 13, for brevity). The legend of HR00, HR02, HR04, HR06, HR08, HR16, HR20, and HR24 may correspond to a series of time points {0, 2, 4, 6, 8, 16, 20, and 24} along the time axis, in unit of hour.

As shown in FIG. 14, the valley information may comprise a valley location and a valley height of each valley of the valleys regarding each curve of the curves shown in FIG. 13, where the valley location and the valley height may be recorded as the horizontal and the coordinate values of a corresponding point (labeled with a circle in FIG. 14, for clearly indicating the point with the center of the circle). For example, the valley height may be measured with the cell number such as that in the Vth-distribution plot, and may be illustrated with the linear scale along the vertical axis of FIG. 14, but the present invention is not limited thereto. For another example, the valley height may be regarded as the amount of errors according to some viewpoints. As shown in FIG. 15, the valley information may further comprise a valley width, such as a maximum extendable voltage range from the valley location toward the curve (e.g. the voltage distribution curve) comprising this valley regarding the N2 processing. Within the maximum extendable voltage range, the memory controller 110 is capable of obtaining the correctable codeword through the N2 processing, having no need to perform any processing within the N4 processing, the N6 processing, and the N8 processing. The memory controller 110 may try extending an initial extendable voltage range from the valley location toward the curve comprising this valley, and more particularly, may perform binary search according to whether any processing within the N4 processing, the N6 processing, and the N8 processing is required, to determine the maximum extendable voltage range in which only the N2 processing is needed. As a result, the memory controller 110 may recorded the maximum extendable voltage range to be the valley width. The valley width may be regarded as a hard-decoding (HD) pass range according to some viewpoints.

According to some embodiments, the memory controller 110 may record the valley information of the NV memory 120 with respect to physical locations (e.g. physical addresses) within the NV memory 120 into one or more tables, and store the one or more tables in storage space of a certain storage unit within the memory controller 110 for further use. For example, the memory controller 110 may optimize the read voltages according to the valley information.

V. Accurate Setting of Read Voltage Via Machine Learning

Storing the Vth-distribution characteristics (e.g. the valley information) for all of the memory cells in the NV memory 120 would be helpful on accurately reading the bits stored in each of the memory cells in the NV memory 120, but this requires huge storage space, and therefore is not practical. By performing machine learning based on a reinforcement learning model according to valley information of the valleys of the Vth-distribution, the memory controller 110 can accurately set the read voltage during reading. As a result, the huge storage space requirement can be significantly reduced.

In the background scan, the memory controller 110 may load a Vth-tracking procedure to perform Vth-tracking according to the Vth-tracking control scheme. When the best read voltages are found in the Vth-tracking, the memory controller 110 may collect the valley information of the physical pair pages (e.g. three logical pages respectively corresponding to the least significant bit (LSB), the central significant bit (CSB), and the most significant bit (MSB) for a TLC flash memory), such as the valley location, the valley height, and the valley width (e.g. the HD pass range). Since one physical pair page of the TLC flash memory has seven read points corresponding to seven valleys, there are seven sets of corresponding valley information. The memory controller 110 may send the valley information into the reinforcement learning model to find the shortest decoding delay read points (e.g. the best read voltage). The reinforcement learning model may be expressed as follows:

$$D = \sum_{n=1}^{N_{IP}} \sum_{k=1}^{K} Coef_{n,k} (x_n - t_k)^2$$

where $N_1$ may represent the total input pattern count such as training sequence amount, K may represent the number of cluster, such as the seven read points for the TLC flash memory, $x_n$ may represent the input read point's error behavior regarding the index n, such as the valley location, $t_k$ may represent the target read point's error behavior regarding the index n, $Coef_{n,k}$ may represent the weighting function, for example, a correction function f(VH, HD_pass_Win) related to the valley height VH and the valley width such as the HD pass range HD_pass_Win, and D may represent the error distance in the machine learning. According to this embodiment, the error distance D will be minimized by the machine leaning based on the reinforcement learning model. In addition, the weighting function such as the correction function f(VH, HD_pass_Win) may have a positive correlation with the valley height VH and may have a negative correlation with the valley width such as the HD pass range HD_pass_Win. For example, f(VH, HD_pass_Win)=(a*VH)−(b*HD_pass_Win), where a>0 and b>0, but the present invention is not limited thereto. According to some embodiments, f(VH, HD_pass_Win)=$VH^a$/$HD\_pass\_Win^b$, where a>1 and b>1.

After a large amount of background scan, the memory controller 110 may have collected the valley information respectively corresponding to the valleys. The memory controller 110 may perform the background scan and perform the machine learning based on the reinforcement learning model alternately or at the same time. Through the machine learning, the memory controller 110 may obtain the best read voltages respectively corresponding to the valleys, such as the optimized read point $\{t_k\}$. By utilizing the optimized read point $\{t_k\}$ during reading, the memory controller 110 can minimize the total amount of errors.

Some implementation details regarding the machine learning may be described as follows. A higher value of the valley height VH may indicate that the read point is erroneous, and more particularly, there are more error bits. A lower value of the valley height VH may indicate that the read point is correct or almost correct, and more particularly, there are less error bits. In addition, the valley width such as the HD pass range HD_pass_Win may indicate the range in which the hard-decoding should be successful. If the HD pass range HD_pass_Win is larger, it means that the read point may have greater compatibility, and may be compromised with a shift of this read point, such as other inputs corresponding to smaller valley widths (e.g. the read points of one or more other input patterns). Additionally, when the valley height VH is high and the valley width such as the HD pass range HD_pass_Win is narrow, the weighting of the weighting function $Coef_{n,k}$ should be increased, and the correction function f(VH, HD_pass_Win) should have larger value to increase the influence of the corresponding term $(x_n-t_n)^2$ during the machine learning, since the read point has a higher probability of generating more error bits. When the valley height VH is low and the valley width such as the HD pass range HD_pass_Win is wide, the weighting of the weighting function $Coef_{n,k}$ should be decreased, and the correction function f(VH, HD_pass_Win) should have smaller value to decrease the influence of the corresponding term $(x_n-t_n)^2$ during the machine learning, to provide more adjustable range for other inputs (e.g. other input patterns) in the machine learning.

Figure 16:
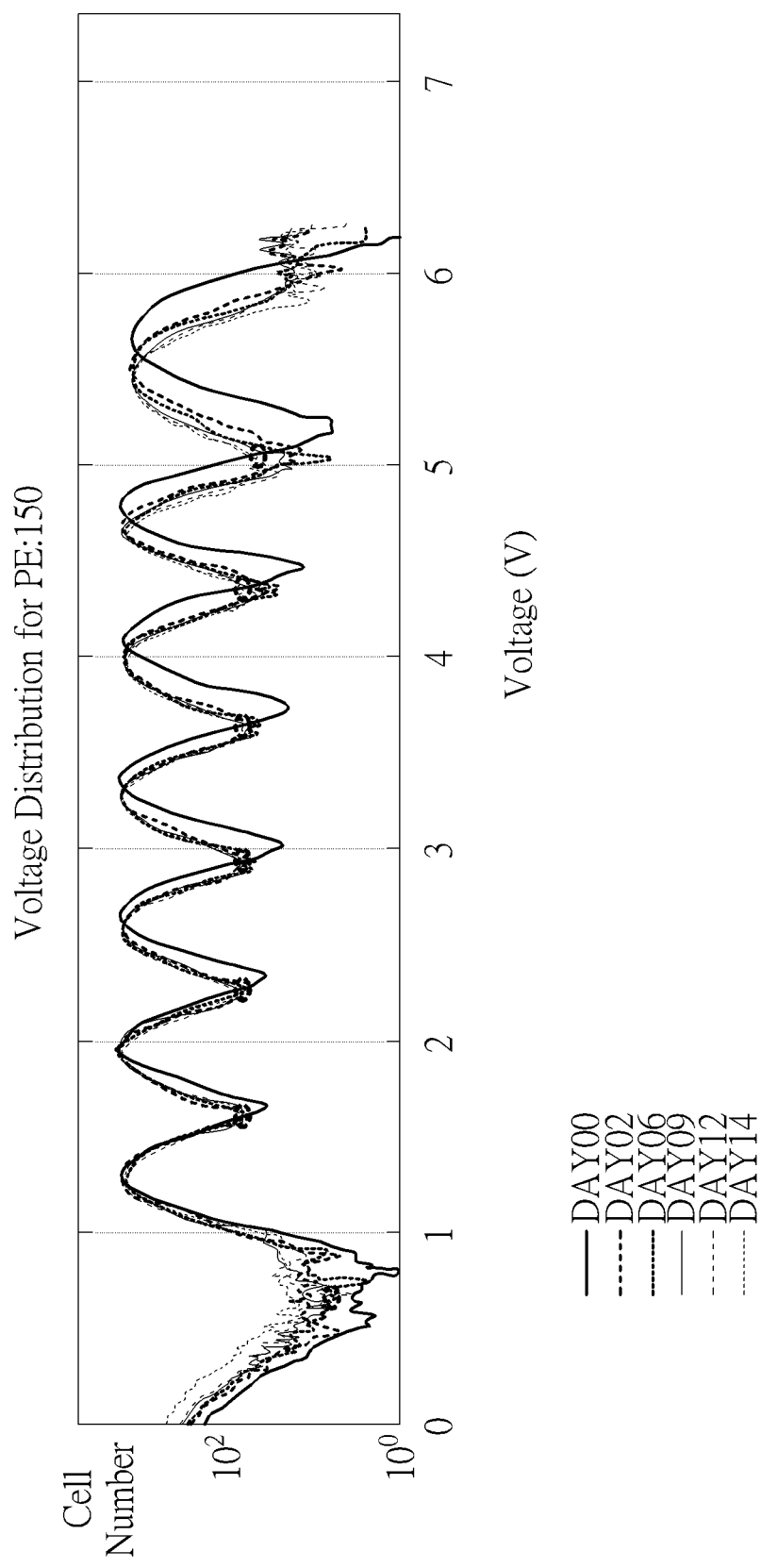
FIG. 16 illustrates some best read points obtained from valley information of the TLC Vth-distribution plot shown in FIG. 10 through a reinforcement learning control scheme according to an embodiment of the present invention.
Figure 17:
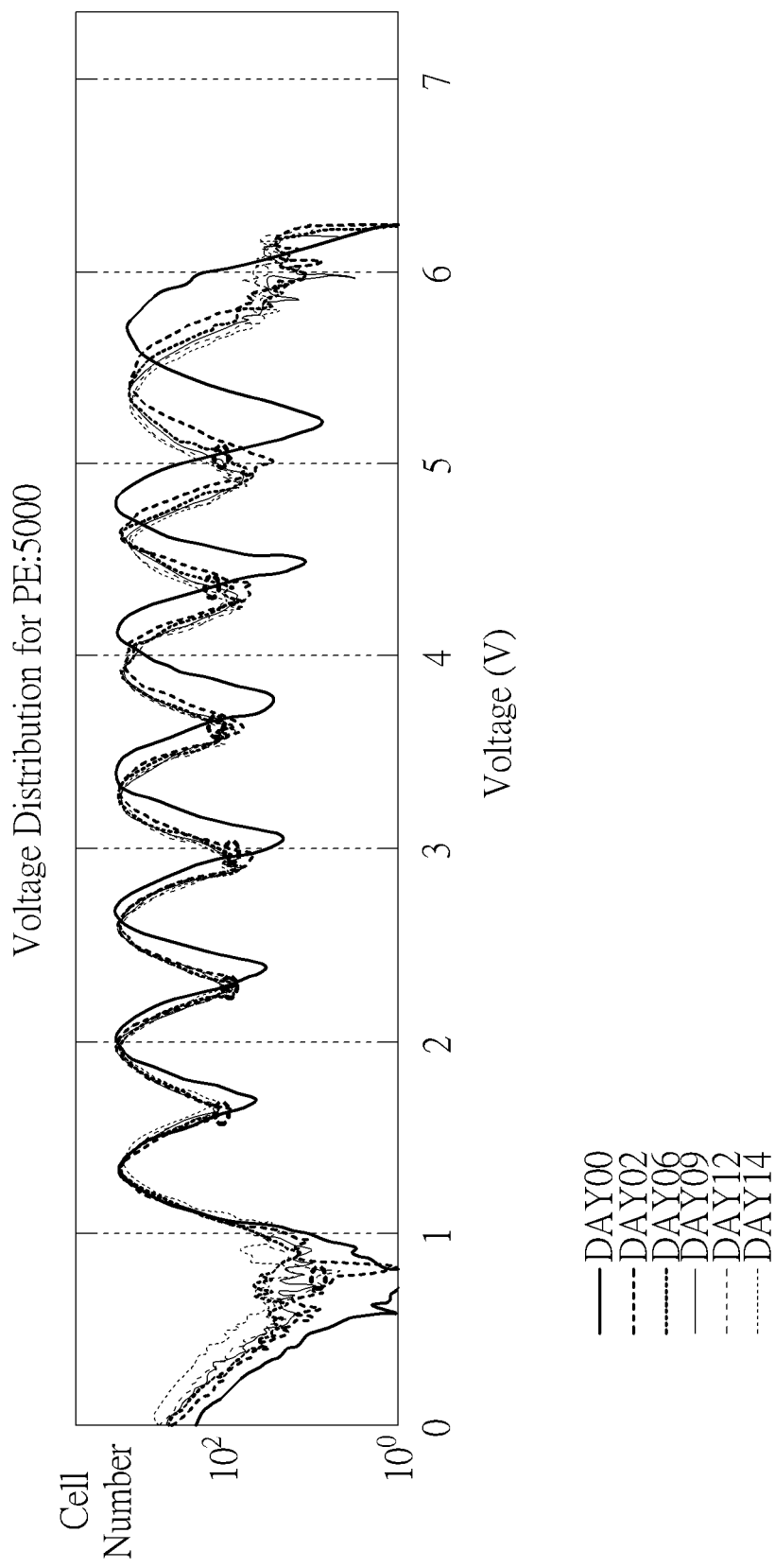
FIG. 17 illustrates some best read points obtained from valley information of the TLC Vth-distribution plot shown in FIG. 11 through the reinforcement learning control scheme according to the embodiment shown in FIG. 16.

FIG. 16 illustrates some best read points obtained from valley information of the TLC Vth-distribution plot shown in FIG. 10 through a reinforcement learning control scheme according to an embodiment of the present invention, and FIG. 17 illustrates some best read points obtained from valley information of the TLC Vth-distribution plot shown in FIG. 11 through the reinforcement learning control scheme in this embodiment. According to this embodiment, the microprocessor 112 may control the memory controller 110 to operate according to the reinforcement learning control scheme, and more particularly, may perform the machine learning based on the reinforcement learning model to find the best read points from the valley information of the Vth-distribution of the NV memory 120. For example, in a situation where the program and erase (P/E) cycle reaches 150 (labeled "PE: 150" in FIG. 16, for brevity), the memory controller 110 may find the best read points corresponding to a certain length of data life time, such as the best read points corresponding to 14 day-data life time, as indicated by the circles illustrated with dashed lines on the curve of the legend DAY14 in FIG. 16. For another example, in a situation where the program and erase (P/E) cycle reaches 5000 (labeled "PE: 5000" in FIG. 17, for brevity), the memory controller 110 may find the best read points corresponding to a certain length of data life time, such as the best read points corresponding to 14 day-data life time, as indicated by the circles illustrated with dashed lines on the curve of the legend DAY14 in FIG. 17. Additionally, the memory controller 110 may perform wear leveling on a plurality of blocks within the NV memory 120 to make the program and erase (P/E) cycle of all of the plurality of blocks be uniform. No matter whether the program and erase (P/E) cycle of the plurality of blocks is higher or lower, the memory controller 110 may find the best read points corresponding to a certain length of data life time, such as the best read points corresponding to 14 day-data life time, as shown in any of FIG. 16 and FIG. 17.

According to some embodiments, the microprocessor 112 may control the memory controller 110 to operate according to the reinforcement learning control scheme, and more particularly, may perform the machine learning based on the reinforcement learning model to find the best read points from the valley information of the Vth-distribution of the NV memory 120 for different lengths of data life time (e.g. different ranges of data life time), respectively. For example, the memory controller 110 may find a first set of best read points corresponding to a first range of data life time, and read data corresponding to the first range of data life time by using the first set of best read points. In addition, the memory controller 110 may find a second set of best read points corresponding to a second range of data life time, and read data corresponding to the second range of data life time by using the second set of best read points. Additionally, the memory controller 110 may find a third set of best read points corresponding to a third range of data life time, and read data corresponding to the third range of data life time by using the third set of best read points.

Figure 18:
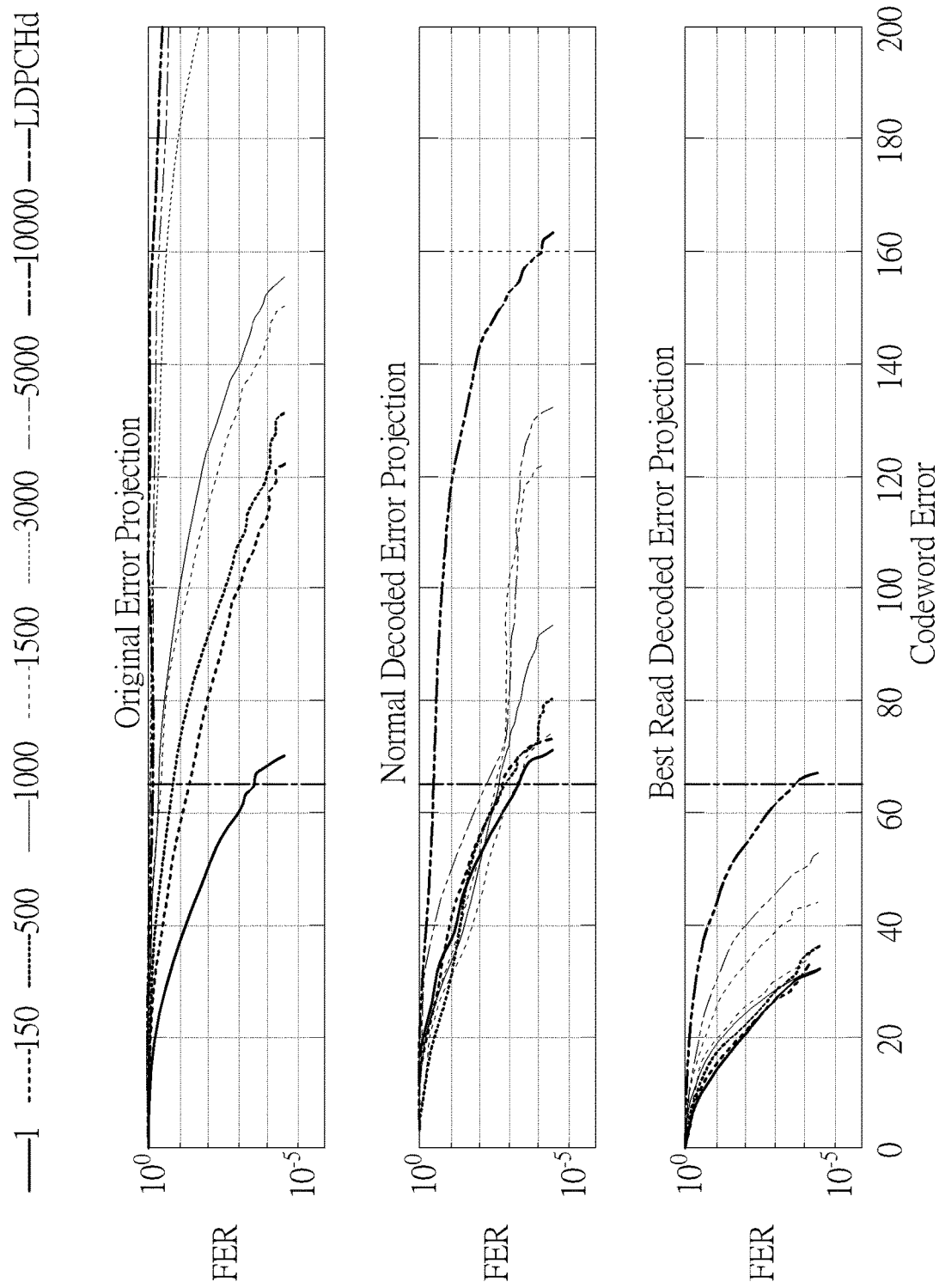
FIG. 18 illustrates three sets of curves indicating data retention improvement according to an embodiment of the present invention.

FIG. 18 illustrates three sets of curves indicating data retention improvement according to an embodiment of the present invention, where the three sets of curves may comprise a first set of curves corresponding to the original error projection, a second set of curves corresponding to the normal decoded error projection, and a third set of curves corresponding to the best read decoded error projection. The codeword error on the horizontal axis may represent the error bit count per 1 KB ECC chunk, such as the number of error bits in an ECC chunk of one kilobyte (KB). The frame error rate (FER) on the vertical axis may be expressed as follows:

$$FER=1-Pro(\text{error bit count per chunk}<t);$$

where Pro( ) may represent a projection such as a mapping, and t may represent the coordinate value on the horizontal axis. In FIG. 18, the legend of 1, 150, 500, 1000, 1500, 3000, 5000, and 10000 may correspond to the numbers of program and erase (P/E) cycles, such as 1, 150, 500, 1000, 1500, 3000, 5000, and 10000 cycles, respectively, and the vertical lines corresponding to the legend LDPCHd (e.g. vertical dashed lines shown in FIG. 18) may indicate a correction capability threshold value of low delay decoding (e.g. only the N2 processing is triggered). For example, the length of data life time may be 14 day-data life time.

Assume that the memory controller 110 may be configured to utilize a set of default read voltages (e.g. fixed read voltages) during reading. In this situation, the first set of curves may extend to the right-hand side of the correction capability threshold value, far from the correction capability threshold value, which is the worst case within the three set of curves. For example, the intersection of the curve corresponding to the legend of 1 and the vertical line corresponding to the legend LDPCHd may have a vertical coordinate value in the interval of $10^{-4}$ to $10^{-3}$, which means the probability of triggering high delay decoding (e.g. after the N2 processing is triggered, at least one portion of subsequent processing within the N4 processing, the N6 processing, and the N8 processing is triggered) is $10^{-4}$ to $10^{-3}$. In addition, assume that the memory controller 110 may be configured to utilize a set of least recently used (LRU) read voltages (e.g. the read voltages of the previous successful decoding) during reading. In this situation, the second set of curves may extend to the right-hand side of the correction capability threshold value, closer to the correction capability threshold value in comparison with the first set of curves. The probability of triggering the high delay decoding (e.g. after the N2 processing is triggered, at least one portion of subsequent processing within the N4 processing, the N6 processing, and the N8 processing is triggered) is still too high.

According to this embodiment, the memory controller 110 may be configured to utilize a set of best read voltages (e.g. the read voltages obtained from the machine learning based on the reinforcement learning model) during reading. In this situation, most of the third set of curves may be within the left-hand side of the correction capability threshold value, which is the best case within the three set of curves. In order to make all of the third set of curves be within the left-hand side of the correction capability threshold value to prevent any intersection of the curve corresponding to the legend of 10000 and the vertical line corresponding to the legend LDPCHd, the memory controller 110 may decrease the period of the background scan. Therefore, the memory controller 110 can keep staying within the low delay decoding (e.g. only the N2 processing is triggered) and prevent the high delay decoding.

VI. Robust Control Mechanism

According to some embodiments, at least one portion of the electronic device 10, such as at least one of the host device 50 (e.g. the processor 52 therein) and the memory device 100 (e.g. the memory controller 110 therein), may be arranged to trigger the background scan of the NV memory 120 within the memory device 100 (more particularly, the plurality of NV memory elements 122-1, 122-2, ..., and 122-N) and perform the machine learning based on the reinforcement learning model according to the valley information of the NV memory 120, to generate or update a plurality of tables such as the tables TB1, TB2, and TB3. Each of the plurality of tables may store a set of read voltages as the best read points of the NV memory 120 for different sections of data life time, respectively, and these sections of data life time may comprise a first section of data life time, a second section of data life time, and a third section of data life time, for example, from young to old. The table TB1 may store a first set of read voltages (e.g. 7 read voltages for TLC memory cells, 15 read voltages for QLC memory cells, etc.) as the best read points of the NV memory 120 for the first section of data life time, the table TB2 may store a second set of read voltages (e.g. 7 read voltages for TLC memory cells, 15 read voltages for QLC memory cells, etc.) as the best read points of the NV memory 120 for the second section of data life time, and the table TB3 may store a third set of read voltages (e.g. 7 read voltages for TLC memory cells, 15 read voltages for QLC memory cells, etc.) as the best read points of the NV memory 120 for the third section of data life time. In addition, the memory device 100 (e.g. the memory controller 110) may read data having certain data life time according to the best read points corresponding to the data life time of the data. For example, the memory controller 110 may select a certain table corresponding to the data life time of the data from the plurality of tables such as the tables TB1, TB2, and TB3, to obtain the best read points corresponding to the data life time of the data from this table, in order to achieve the best read performance through the N2 processing.

Figure 19:
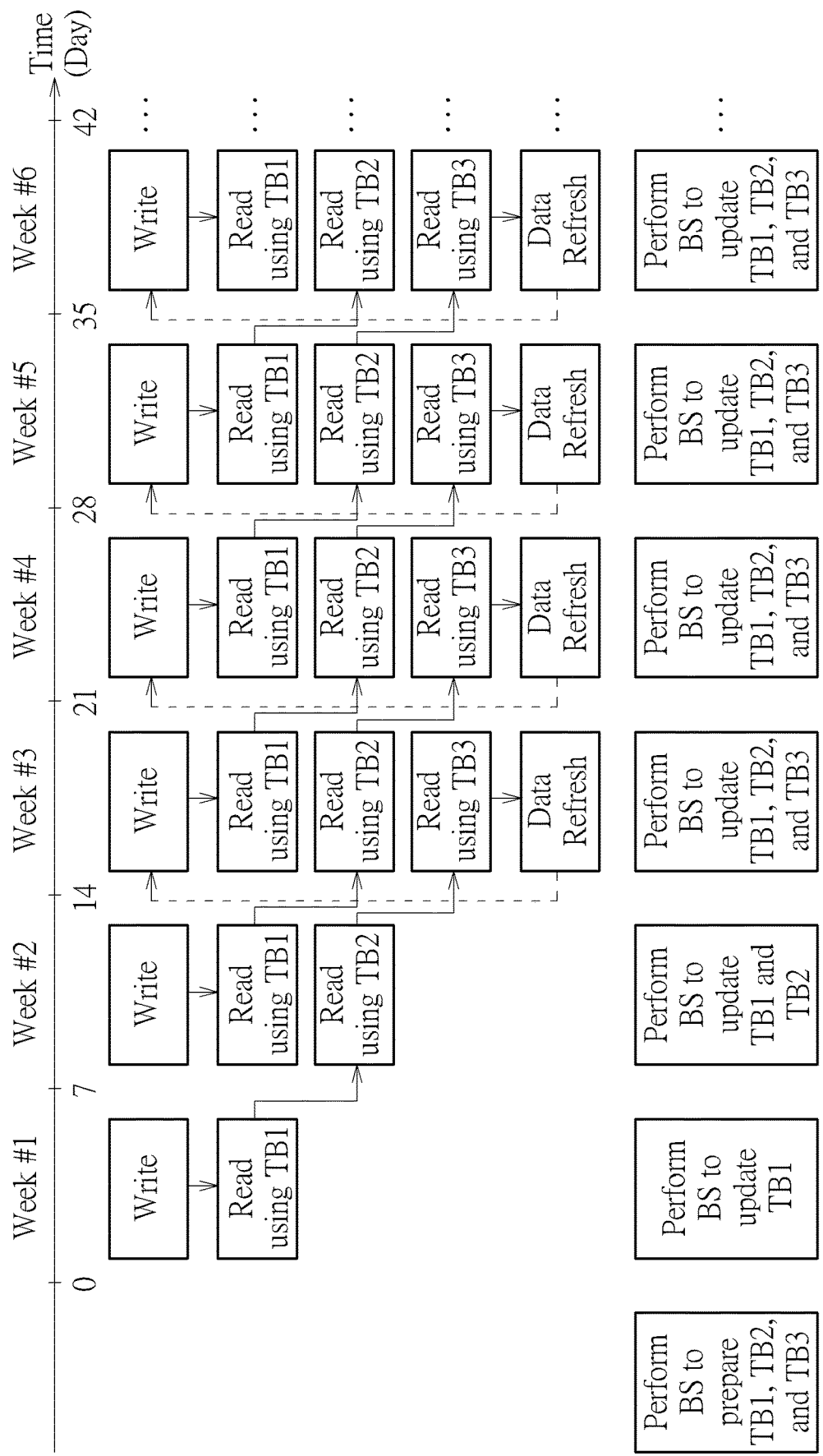
FIG. 19 illustrates a method for performing access control regarding quality of service (QoS) optimization of a memory device with aid of machine learning according to an embodiment of the present invention.

FIG. 19 illustrates a method for performing access control regarding quality of service (QoS) optimization of a memory device with aid of machine learning according to an embodiment of the present invention, where the control schemes in some of the embodiments described above (e.g. the Vth-tracking control scheme, the background scan control scheme, the noise margin recording control scheme, and the reinforcement learning control scheme) may be adopted in the method. The method may be applied to the electronic device 10, the memory device 100, and the memory controller 110 which may be arranged to control the accessing of the NV memory 120. For example, the memory device 100 (e.g. the memory controller 110) may operate according to the method. More particularly, the table and data-refresh control circuit 114TD may select a suitable table from the tables TB1, TB2, and TB3 for the memory controller 110 during reading according to the method, and manage and update the tables TB1, TB2, and TB3 for the memory controller 110. Based on the method, the memory controller 110 may perform the access control regarding the QoS optimization of the memory device 100 with aid of the machine learning based on the reinforcement learning model.

As shown in FIG. 19, the memory controller 110 (e.g. the table and data-refresh control circuit 114TD) may perform a series of operations corresponding to in the weeks #1, #2, #3, #4, #5, #6, etc. (e.g. the series of time intervals between the time points {0, 7, 14, 21, 28, 35, 42, ... } along the time axis, in unit of day or 24 hours), where the period for performing the series of operations may be one week, but the present invention is not limited thereto. For example, the memory controller 110 may perform background scan (labeled "BS" in FIG. 19, for brevity) to prepare the tables TB1, TB2, and TB3 through the machine learning based on the reinforcement learning model in advance. In addition, the memory controller 110 may perform background scan to update at least one portion (e.g. a portion or all) of the tables TB1, TB2, and TB3 through the machine learning based on the reinforcement learning model in a current week (e.g. any of the weeks #1, #2, etc.), depending on whether they will be used in this week. For example, the memory controller 110 may perform background scan to update the table TB1 every week starting from the first week such as the week #1, perform background scan to update the table TB2 every week starting from the second week such as the week #2, and perform background scan to update the table TB3 every week starting from the third week such as the week #3.

During the first week such as the week #1, the memory controller 110 may write first data and read the first data using the table TB1. For example, the table and data-refresh control circuit 114TD may select the table TB1 as the suitable table for the first data during this week. During the second week such as the week #2, the memory controller 110 may read the first data using the table TB2 since the data retention property of the first data may become worse. For example, the table and data-refresh control circuit 114TD may select the table TB2 as the suitable table for the first data during this week. During the third week such as the week #3, the memory controller 110 may read the first data using the table TB3 and perform data refresh on the first data since the data retention property of the first data may become much worse. For example, the table and data-refresh control circuit 114TD may select the table TB3 as the suitable table for the first data during this week. During the data refresh of the first data, the memory controller 110 (e.g. the table and data-refresh control circuit 114TD) may write the first data that has just been read using the table TB3 from at least one old physical address (which may indicate one or more old physical pages, one or more old physical blocks, etc.) to at least one new physical address (which may indicate one or more other physical pages, one or more other physical blocks, etc.), invalidate the storage unit at the old physical address, and update the logical-to-physical address mapping relationship between the logical address and the physical address of the first data, in order to refresh the first data to be the same data at the new physical address, but the present invention is not limited thereto. For another example, during the data refresh, the memory controller 110 (e.g. the table and data-refresh control circuit 114TD) may read the first data using the table TB3 from the old physical address, write the first data to the new physical address, invalidate the storage unit at the old physical address, and update this mapping relationship, in order to refresh the first data to be the same data at the new physical address.

During the second week such as the week #2, the memory controller 110 may write second data and read the second data using the table TB1. For example, the table and data-refresh control circuit 114TD may select the table TB1 as the suitable table for the second data during this week. During the third week such as the week #3, the memory controller 110 may read the second data using the table TB2 since the data retention property of the second data may become worse. For example, the table and data-refresh control circuit 114TD may select the table TB2 as the suitable table for the second data during this week. During the fourth week such as the week #4, the memory controller 110 may read the second data using the table TB3 and perform data refresh on the second data since the data retention property of the second data may become much worse. For example, the table and data-refresh control circuit 114TD may select the table TB3 as the suitable table for the second data during this week. During the data refresh of the second data, the memory controller 110 (e.g. the table and data-refresh control circuit 114TD) may write the second data that has just been read using the table TB3 from at least one old physical address (which may indicate one or more old physical pages, one or more old physical blocks, etc.) to at least one new physical address (which may indicate one or more other physical pages, one or more other physical blocks, etc.), invalidate the storage unit at the old physical address, and update the logical-to-physical address mapping relationship between the logical address and the physical address of the second data, in order to refresh the second data to be the same data at the new physical address, but the present invention is not limited thereto. For another example, during the data refresh, the memory controller 110 (e.g. the table and data-refresh control circuit 114TD) may read the second data using the table TB3 from the old physical address, write the second data to the new physical address, invalidate the storage unit at the old physical address, and update this mapping relationship, in order to refresh the second data to be the same data at the new physical address.

Within the series of operations corresponding to in the weeks #1, #2, #3, #4, #5, #6, etc., the operations related to the data written during any week of the subsequent weeks #3, #4, #5, #6, etc. can be deduced by analogy. In addition, the table and data-refresh control circuit 114TD may perform the operations of selecting the suitable table from the tables TB1, TB2, and TB3 for the memory controller 110 during reading, the operations of managing and updating the tables TB1, TB2, and TB3 for the memory controller 110, and the operations of refreshing the data (e.g. the first data, the second data, etc.) having the data life time reaching a predetermined value such as 14 days or 336 hours, but the present invention is not limited thereto. According to some embodiments, the microprocessor 112 may perform at least one portion (e.g. a portion or all) of these operations. For example, the microprocessor 112 may perform all of these operations, and the table and data-refresh control circuit 114TD may be omitted. Based on the method shown in FIG. 19, the memory controller 110 can guarantee that the whole system (e.g. the host device 50 and the memory device 100) can operate properly, to prevent the problems in the related art, such as the increased bit error rate, the increased random read delay, and some associated problems due to the data-retention problem. For brevity, similar descriptions for this embodiment are not repeated in detail here.

Figure 20:
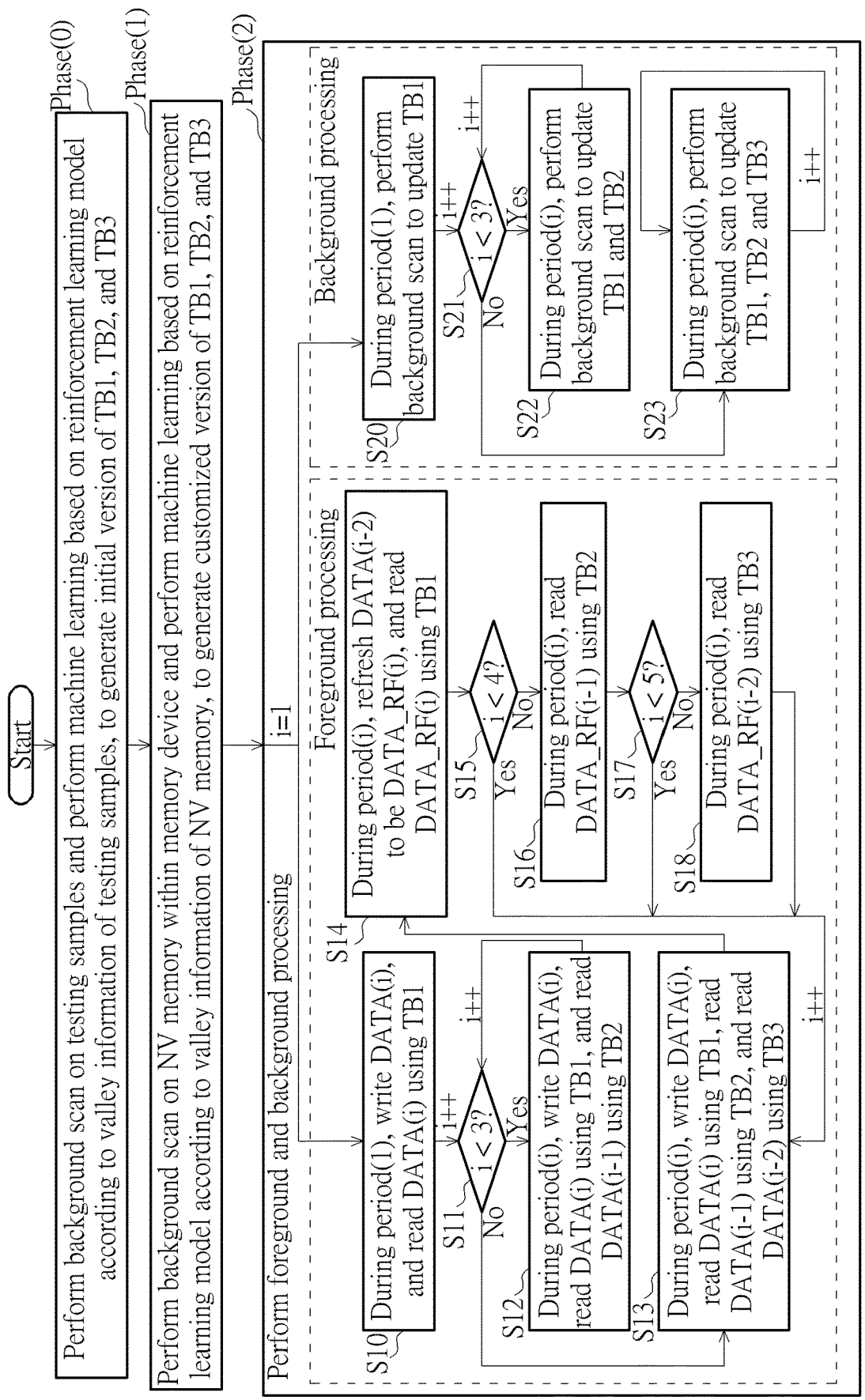
FIG. 20 is a working flow of the method shown in FIG. 19 according to an embodiment of the present invention.

FIG. 20 is a working flow of the method shown in FIG. 19 according to an embodiment of the present invention. For better comprehension, operations of some steps of the working flow may be described as the operations in a plurality of phases Phase(0), Phase(1), and Phase(2). For example, the phase Phase(0) may represent a production phase of the memory device 100, and the phases Phase(1) and Phase(2) may represent sub-phases of a user phase for the user to use the memory device 100, but the present invention is not limited thereto. According to some embodiments, the phases Phase(0) and Phase(1) may represent sub-phases of a production phase of the memory device 100, and the phase Phase(2) may represent a user phase for the user to use the memory device 100. In addition, a series of time intervals such as {period(1), period(2), . . . } may be described as {period(i)}, where the index i may be a positive integer. The series of operations corresponding to in the weeks #1, #2, etc. in the embodiment shown in FIG. 19 may be taken as examples of the associated operations performed by memory controller 110 in the series of time intervals {period(1), period(2), . . . }, respectively. For example, all of the data written into the NV memory 120 by the memory controller 110 during a certain time interval such as period(i) (e.g. any week of the weeks #1, #2, etc.) may be collectively referred to as the data DATA(i). For another example, all of the refreshed data written into the NV memory 120 by the memory controller 110 during a certain time interval such as period(i) may be collectively referred to as the data DATA_RF(i).

In the phase Phase(0), a first production tool such as another host device (e.g. a personal computer such as a desktop computer and a laptop computer) may perform background scan on a plurality of testing samples and perform the machine learning based on the reinforcement learning model according to the valley information of the plurality of testing samples, to generate the respective initial versions of the tables TB1, TB2, and TB3. For example, the plurality of testing samples may represent a plurality of NV memories having the same product model number as that of the NV memory 120. For another example, the plurality of testing samples may represent a set of NV memory elements having the same product model number as that of the plurality of NV memory elements 122-1, 122-2, . . . , and 122-N. According to this embodiment, the plurality of testing samples may be installed at a plurality of memory devices having the same product model number as that of the memory device 100, but the present invention is not limited thereto. According to some embodiments, at least one portion (e.g. a portion or all) of the plurality of testing samples may be installed at a second production tool coupled to the first production tool, such as another memory device having the same product model number as that of the memory device 100, and the other memory device may have a modified architecture (e.g. one or more sockets, etc.) for installing the aforementioned at least one portion of the plurality of testing samples.

In the phase Phase(1), the memory controller 110 (e.g. the microprocessor 112) may perform background scan on the NV memory 120 within the memory device 100 (more particularly, the plurality of NV memory elements 122-1, 122-2, . . . , and 122-N) and perform the machine learning based on the reinforcement learning model according to the valley information of the NV memory 120, to generate the respective customized versions of the tables TB1, TB2, and TB3. As a result, the memory controller 110 (e.g. the microprocessor 112) may update the respective initial versions of the tables TB1, TB2, and TB3 to be the respective customized versions of the tables TB1, TB2, and TB3.

In the phase Phase(2), the memory controller 110 may perform foreground and background processing. The foreground processing may comprise operations of Step S10 to S18, and the background processing may comprise operations of Step S20 to S23. For better comprehension, some pseudo codes corresponding to the C language may be used for illustrating the working flow, but the present invention is not limited thereto. For example, the pseudo code "i++" may represent increasing the index i with the increment of one, and the pseudo code "i=1" may represent setting the initial value of the index i as one.

In Step S10, during the first time interval such as period (1), the memory controller 110 may write the data DATA(i) (e.g. the data DATA(1)), and read the data DATA(i) (e.g. the data DATA(1)) using the table TB1. Afterward, the memory controller 110 may increase the index i with the increment of one.

In Step S11, the memory controller 110 may check whether i<3. If i<3, Step S12 is entered; otherwise, Step S13 is entered.

In Step S12, during the current time interval such as period(i) (e.g. the second time interval such as period(2)), the memory controller 110 may write the data DATA(i) (e.g. the data DATA(2)), read the data DATA(i) (e.g. the data DATA(2)) using the table TB1, and read the data DATA(i−1) (e.g. the data DATA(1)) using the table TB2. Afterward, the memory controller 110 may increase the index i with the increment of one.

In Step S13, during the current time interval such as period(i) (e.g. the third time interval such as period(3), or one of the subsequent time intervals such as period(4), period(5), etc.), the memory controller 110 may write the data DATA(i), read the data DATA(i) using the table TB1, read the data DATA(i−1) using the table TB2, and read the data DATA(i−2) using the table TB3. Afterward, the memory controller 110 may increase the index i with the increment of one.

In Step S14, during the current time interval such as period(i) (e.g. the third time interval such as period(3), or one of the subsequent time intervals such as period(4), period(5), etc.), the memory controller 110 may refresh the data DATA(i−2) to be the data DATA_RF(i), and read the data DATA_RF(i) using the table TB1.

In Step S15, the memory controller 110 may check whether i<4. If i<4, Step S13 is entered; otherwise, Step S16 is entered.

In Step S16, during the current time interval such as period(i) (e.g. the fourth time interval such as period(4), or one of the subsequent time intervals such as period(5), period(6), etc.), the memory controller 110 may read the data DATA_RF(i−1) using the table TB2.

In Step S17, the memory controller 110 may check whether i<5. If i<5, Step S13 is entered; otherwise, Step S18 is entered.

In Step S18, during the current time interval such as period(i) (e.g. the fifth time interval such as period(5), or one of the subsequent time intervals such as period(6), period(7), etc.), the memory controller 110 may read the data DATA_RF(i−2) using the table TB3. Please note that on the sub-flow from any of Step S15, S17, and S18 to Step S13, the memory controller 110 may increase the index i with the increment of one.

In Step S20, during the first time interval such as period (1), the memory controller 110 may perform background scan to update the table TB1. Afterward, the memory controller 110 may increase the index i with the increment of one.

In Step S21, the memory controller 110 may check whether i<3. If i<3, Step S22 is entered; otherwise, Step S23 is entered.

In Step S22, during the current time interval such as period(i) (e.g. the second time interval such as period(2)), the memory controller 110 may perform background scan to update the tables TB1 and TB2. Afterward, the memory controller 110 may increase the index i with the increment of one.

In Step S23, during the current time interval such as period(i) (e.g. the third time interval such as period(3), or one of the subsequent time intervals such as period(4), period(5), etc.), the memory controller 110 may perform background scan to update the tables TB1, TB2, and TB3. Afterward, the memory controller 110 may increase the index i with the increment of one, and then Step S23 is entered for the next time interval.

As the tables TB1, TB2 and TB3 are continuously updated through background scan in the background processing, and as the table selected from the tables TB1, TB2 and TB3 to be used during reading target data (e.g. the data DATA(i) to be read) corresponds to the data life of the target data, the memory controller 110 can accurately set the read voltage according to this table, and therefore can correctly obtain every bit of the target data through the N2 processing in the majority of cases. For brevity, similar descriptions for this embodiment are not repeated in detail here.

For better comprehension, the method may be illustrated with the working flow shown in FIG. 20, but the present invention is not limited thereto. According to some embodiments, one or more steps may be added, deleted, or changed in the working flow shown in FIG. 20.

Based on the method, the present invention apparatus (e.g. the electronic device 10, the memory device 100, and the memory controller 110) can enhance the overall performance and prevent the related art problems such as the increased bit error rate, the increased random read delay, and the associated problems due to the data-retention problem.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing access control regarding quality of service (QoS) optimization of a memory device with aid of machine learning, the memory device comprising a non-volatile (NV) memory and a memory controller for controlling the accessing of the NV memory, the NV memory comprising at least one NV memory element, the method comprising:
   performing background scan on the NV memory to collect valley information of voltage distribution of memory cells within the NV memory, and performing machine learning based on a reinforcement learning model according to the valley information, in order to prepare a plurality of tables through the machine learning based on the reinforcement learning model in advance, for use of reading data from the NV memory, wherein each table of the plurality of tables comprises a set of read voltages, and the set of read voltages is obtained from the machine learning based on the reinforcement learning model;
   during a first time interval, writing first data and read the first data using a first table within the plurality of tables, wherein the first table is selected as a suitable table for the first data during the first time interval; and
   during a second time interval, reading the first data using a second table within the plurality of tables, wherein the second table is selected as the suitable table for the first data during the second time interval, and the second time interval is a next time interval of the first time interval on a time axis.

2. The method of claim 1, further comprising:
   during a third time interval, reading the first data using a third table within the plurality of tables, wherein the third table is selected as the suitable table for the first data during the third time interval, and the third time interval is a next time interval of the second time interval on the time axis.

3. The method of claim 2, further comprising:
   during the third time interval, performing data refresh on the first data.

4. The method of claim 3, wherein performing the data refresh on the first data further comprises:
   writing the first data that has just been read using the third table from at least one old physical address to at least one new physical address;
   invalidating a storage unit at said at least one old physical address; and
   updating a logical-to-physical address mapping relationship to refresh the first data to be same data at said at least one new physical address.

5. The method of claim 3, wherein performing the data refresh on the first data further comprises:
   reading the first data using the third table from at least one old physical address;
   writing the first data to at least one new physical address;
   invalidating a storage unit at said at least one old physical address; and
   updating a logical-to-physical address mapping relationship to refresh the first data to be same data at said at least one new physical address.

6. The method of claim 1, further comprising:
   during the second time interval, writing second data and read the second data using the first table, wherein the first table is selected as a suitable table for the second data during the second time interval; and
   during a third time interval, reading the second data using the second table, wherein the second table is selected as the suitable table for the second data during the third time interval, and the third time interval is a next time interval of the second time interval on the time axis.

7. The method of claim 6, further comprising:
   during a fourth time interval, reading the second data using a third table within the plurality of tables, wherein the third table is selected as the suitable table for the second data during the fourth time interval.

8. The method of claim 7, further comprising:
   during the fourth time interval, performing data refresh on the second data.

9. The method of claim 8, wherein performing the data refresh on the second data further comprises:
   writing the second data that has just been read using the third table from at least one old physical address to at least one new physical address;
   invalidating a storage unit at said at least one old physical address; and
   updating a logical-to-physical address mapping relationship to refresh the second data to be same data at said at least one new physical address.

10. The method of claim 8, wherein performing the data refresh on the second data further comprises:
    reading the second data using the third table from at least one old physical address;
    writing the second data to at least one new physical address;
    invalidating a storage unit at said at least one old physical address; and
    updating a logical-to-physical address mapping relationship to refresh the second data to be same data at said at least one new physical address.

11. The method of claim 1, wherein regarding a valley of a plurality of valleys of the voltage distribution, the valley information comprises a valley location, a valley height, and a valley width.

12. The method of claim 11, wherein the reinforcement learning model adopts a weighting function related to the valley height and the valley width.

13. The method of claim 12, wherein the weighting function has a positive correlation with the valley height and has a negative correlation with the valley width.

14. The method of claim 11, wherein the valley width is a hard-decoding (HD) pass range.

15. A memory device, comprising:
    a non-volatile (NV) memory, arranged to store information, wherein the NV memory comprises at least one NV memory element; and
    a controller, coupled to the NV memory, arranged to control operations of the memory device, wherein the controller comprises:

a processing circuit, arranged to control the controller according to a plurality of host commands from a host device, to allow the host device to access the NV memory through the controller, wherein:

the controller performs background scan on the NV memory to collect valley information of voltage distribution of memory cells within the NV memory, and performs machine learning based on a reinforcement learning model according to the valley information, in order to prepare a plurality of tables through the machine learning based on the reinforcement learning model in advance, for use of reading data from the NV memory, wherein each table of the plurality of tables comprises a set of read voltages, and the set of read voltages is obtained from the machine learning based on the reinforcement learning model;

during a first time interval, the controller writes first data and reads the first data using a first table within the plurality of tables, wherein the first table is selected as a suitable table for the first data during the first time interval; and during a second time interval, the controller reads the first data using a second table within the plurality of tables, wherein the second table is selected as the suitable table for the first data during the second time interval, and the second time interval is a next time interval of the first time interval on a time axis.

16. The memory device of claim 15, wherein during a third time interval, the controller reads the first data using a third table within the plurality of tables, wherein the third table is selected as the suitable table for the first data during the third time interval, and the third time interval is a next time interval of the second time interval on the time axis.

17. The memory device of claim 16, wherein during the third time interval, the controller performs data refresh on the first data.

18. A controller of a memory device, the memory device comprising the controller and a non-volatile (NV) memory, the NV memory comprising at least one NV memory element, the controller comprising:

a processing circuit, arranged to control the controller according to a plurality of host commands from a host device, to allow the host device to access the NV memory through the controller, wherein:

the controller performs background scan on the NV memory to collect valley information of voltage distribution of memory cells within the NV memory, and performs machine learning based on a reinforcement learning model according to the valley information, in order to prepare a plurality of tables through the machine learning based on the reinforcement learning model in advance, for use of reading data from the NV memory, wherein each table of the plurality of tables comprises a set of read voltages, and the set of read voltages is obtained from the machine learning based on the reinforcement learning model;

during a first time interval, the controller writes first data and reads the first data using a first table within the plurality of tables, wherein the first table is selected as a suitable table for the first data during the first time interval; and during a second time interval, the controller reads the first data using a second table within the plurality of tables, wherein the second table is selected as the suitable table for the first data during the second time interval, and the second time interval is a next time interval of the first time interval on the time axis.

19. The controller of claim 18, wherein during a third time interval, the controller reads the first data using a third table within the plurality of tables, wherein the third table is selected as the suitable table for the first data during the third time interval, and the third time interval is a next time interval of the second time interval on the time axis.

20. The controller of claim 19, wherein during the third time interval, the controller performs data refresh on the first data.

* * * * *